United States Patent
Xie et al.

(10) Patent No.: US 9,478,634 B2
(45) Date of Patent: Oct. 25, 2016

(54) METHODS OF FORMING REPLACEMENT GATE STRUCTURES ON FINFET DEVICES AND THE RESULTING DEVICES

(71) Applicant: GLOBALFOUNDRIES Inc., Grand Cayman (KY)

(72) Inventors: Ruilong Xie, Niskayuna, NY (US); Xiuyu Cai, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/535,852

(22) Filed: Nov. 7, 2014

(65) Prior Publication Data

US 2016/0133719 A1    May 12, 2016

(51) Int. Cl.

| | |
|---|---|
| *H01L 21/3205* | (2006.01) |
| *H01L 29/66* | (2006.01) |
| *H01L 21/3213* | (2006.01) |
| *H01L 21/311* | (2006.01) |
| *H01L 21/32* | (2006.01) |
| *H01L 21/02* | (2006.01) |

(52) U.S. Cl.
CPC ... *H01L 29/66545* (2013.01); *H01L 21/02164* (2013.01); *H01L 21/31111* (2013.01); *H01L 21/32* (2013.01); *H01L 21/32055* (2013.01); *H01L 21/32133* (2013.01); *H01L 21/32139* (2013.01); *H01L 29/66553* (2013.01)

(58) Field of Classification Search
CPC ............... H01L 29/66545; H01L 29/66795
See application file for complete search history.

(56) References Cited

U.S. PATENT DOCUMENTS

| | | | |
|---|---|---|---|
| 7,915,139 B1 | 3/2011 | Lang et al. | |
| 8,084,346 B1 * | 12/2011 | Guo | H01L 21/2633 |
| | | | 257/E21.182 |
| 9,318,637 B2 | 4/2016 | Haase | |
| 2005/0158934 A1 * | 7/2005 | Yun | H01L 21/82343 |
| | | | 438/197 |
| 2013/0187228 A1 * | 7/2013 | Xie | H01L 29/785 |
| | | | 257/347 |
| 2014/0084383 A1 | 3/2014 | Cai et al. | |
| 2014/0110794 A1 | 4/2014 | Xie et al. | |
| 2014/0306297 A1 * | 10/2014 | Ching | H01L 29/66795 |
| | | | 257/401 |

FOREIGN PATENT DOCUMENTS

TW    201434155 A    9/2014

OTHER PUBLICATIONS

Office Action from related U.S. Appl. No. 14/535,942 dated Jan. 4, 2016.
Translation of Taiwanese Office Action dated Jun. 23, 2016, for TW Application No. 104131391, dated Sep. 23, 2015.

* cited by examiner

*Primary Examiner* — Reema Patel
*Assistant Examiner* — Syed Gheyas
(74) *Attorney, Agent, or Firm* — Amerson Law Firm, PLLC

(57) ABSTRACT

One illustrative method disclosed herein includes, among other things, forming a fin having an upper surface and a plurality of side surfaces, forming a sacrificial gate structure comprised of a low-density oxide material having a density of less than 1.8 g/cm³ on and in contact with the upper surface and the side surfaces of the fin and a sacrificial gate material positioned on and in contact with the upper surface of the low-density oxide material, and forming a sidewall spacer adjacent the sacrificial gate structure. The method further includes removing the sacrificial gate material so as to thereby expose the low-density oxide material, so as to define a replacement gate cavity, and forming a replacement gate structure in the replacement gate cavity.

18 Claims, 21 Drawing Sheets

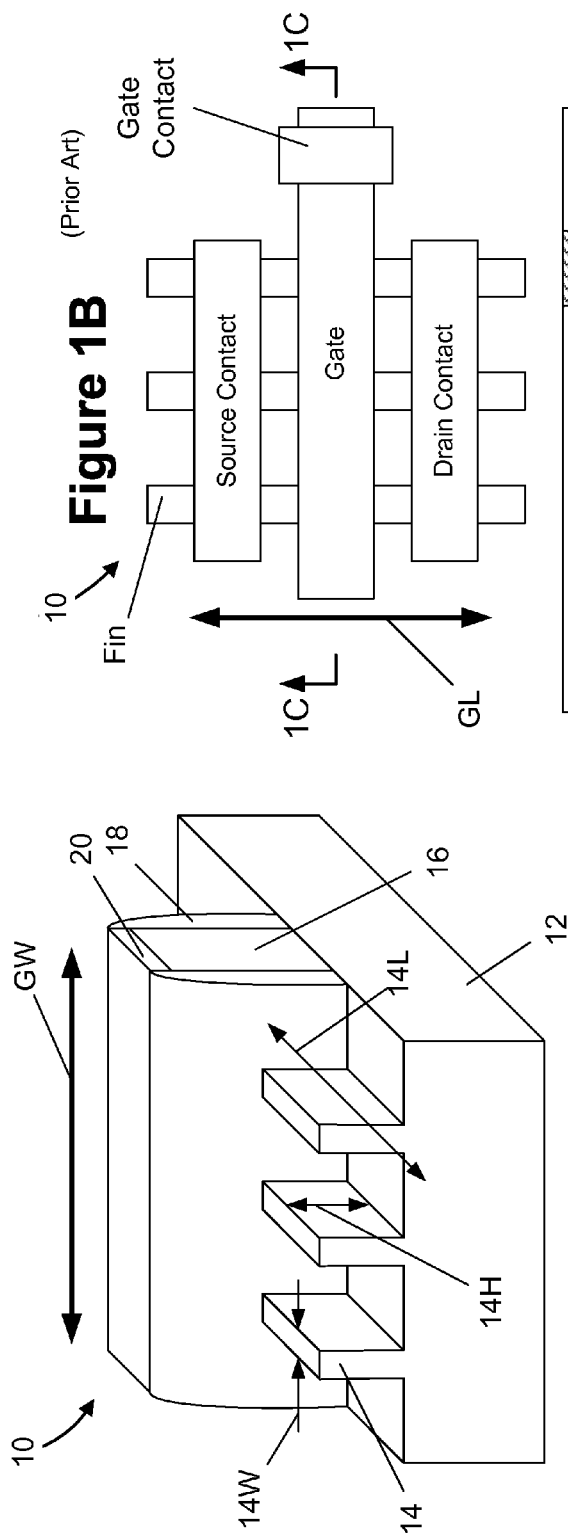
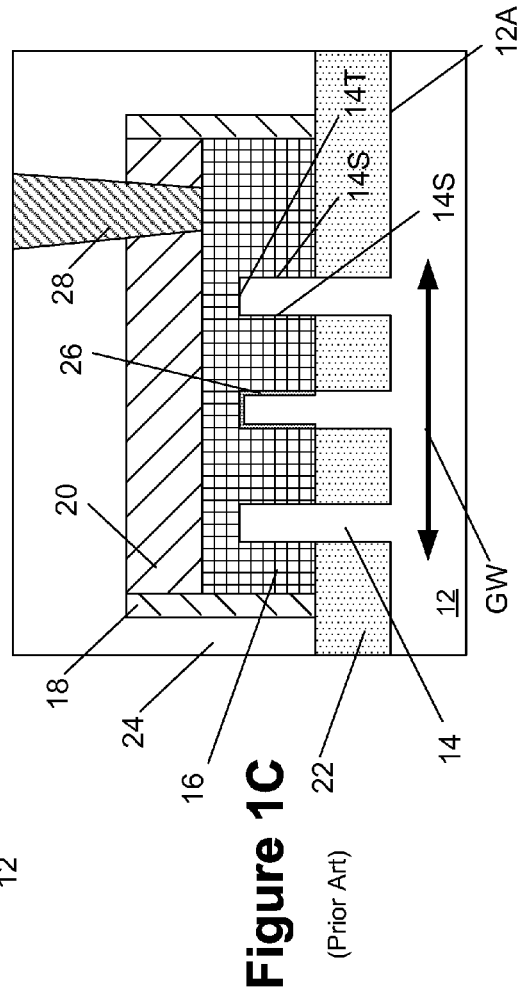
Figure 1A
Figure 1B (Prior Art)
Figure 1C (Prior Art)

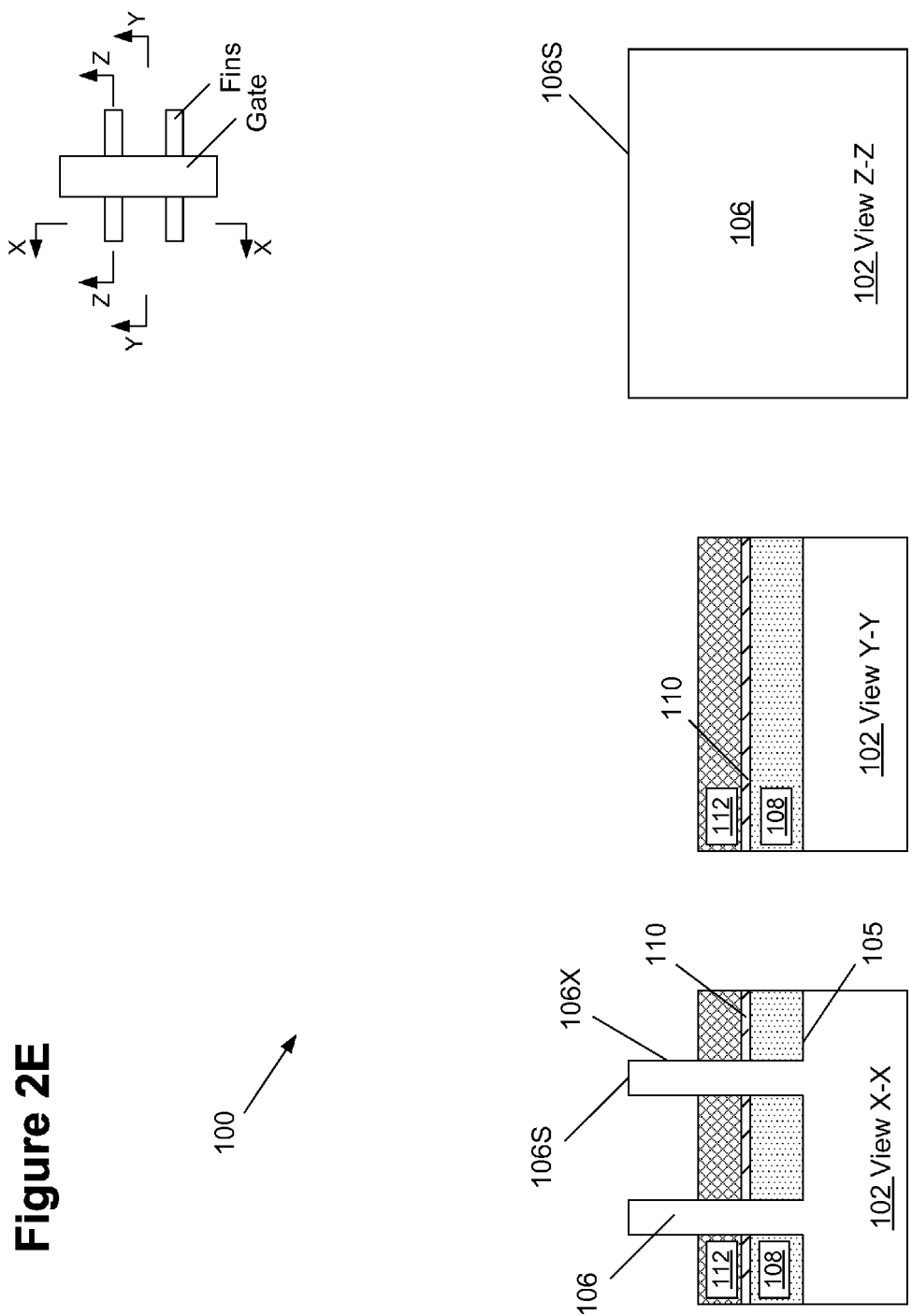

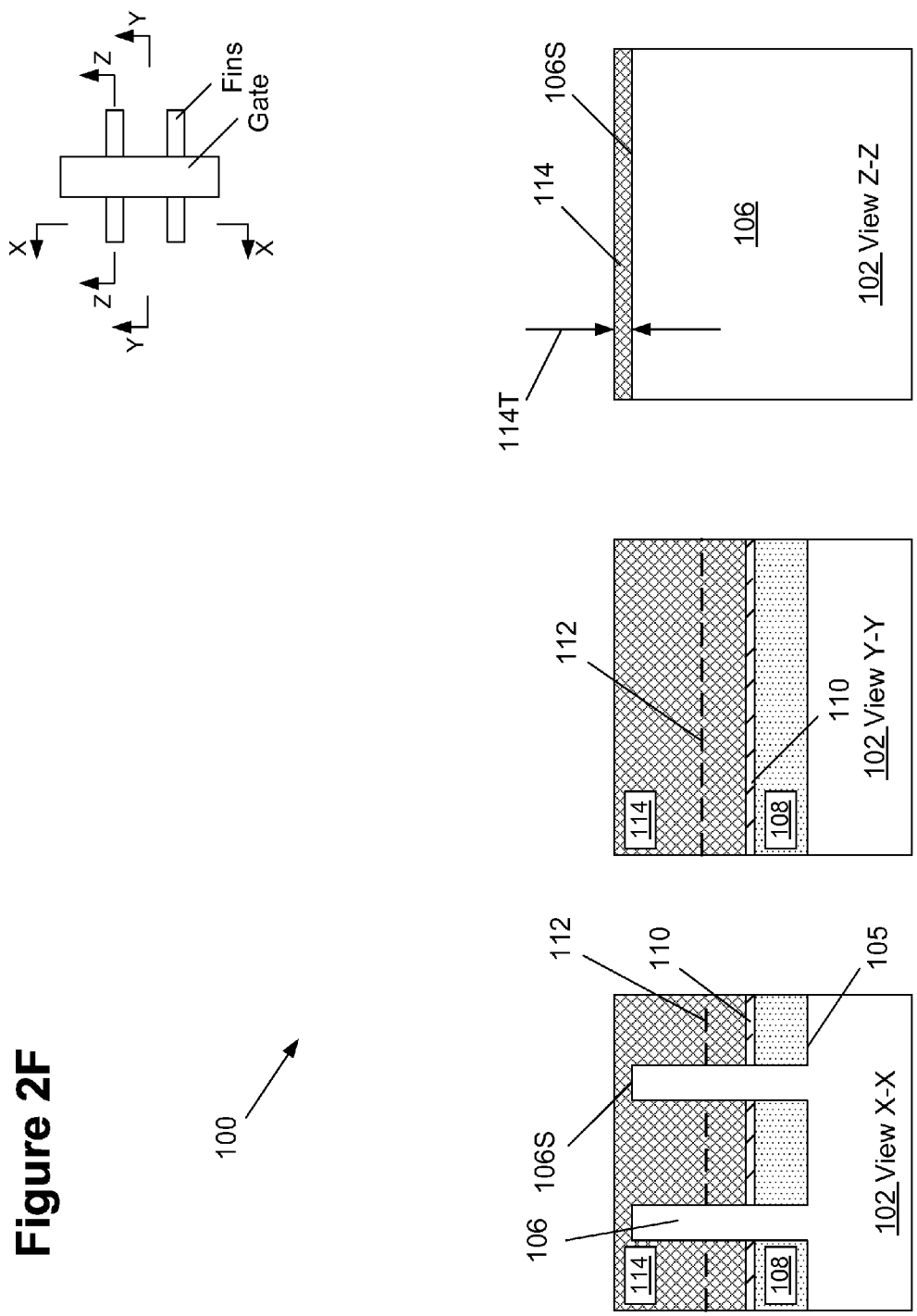

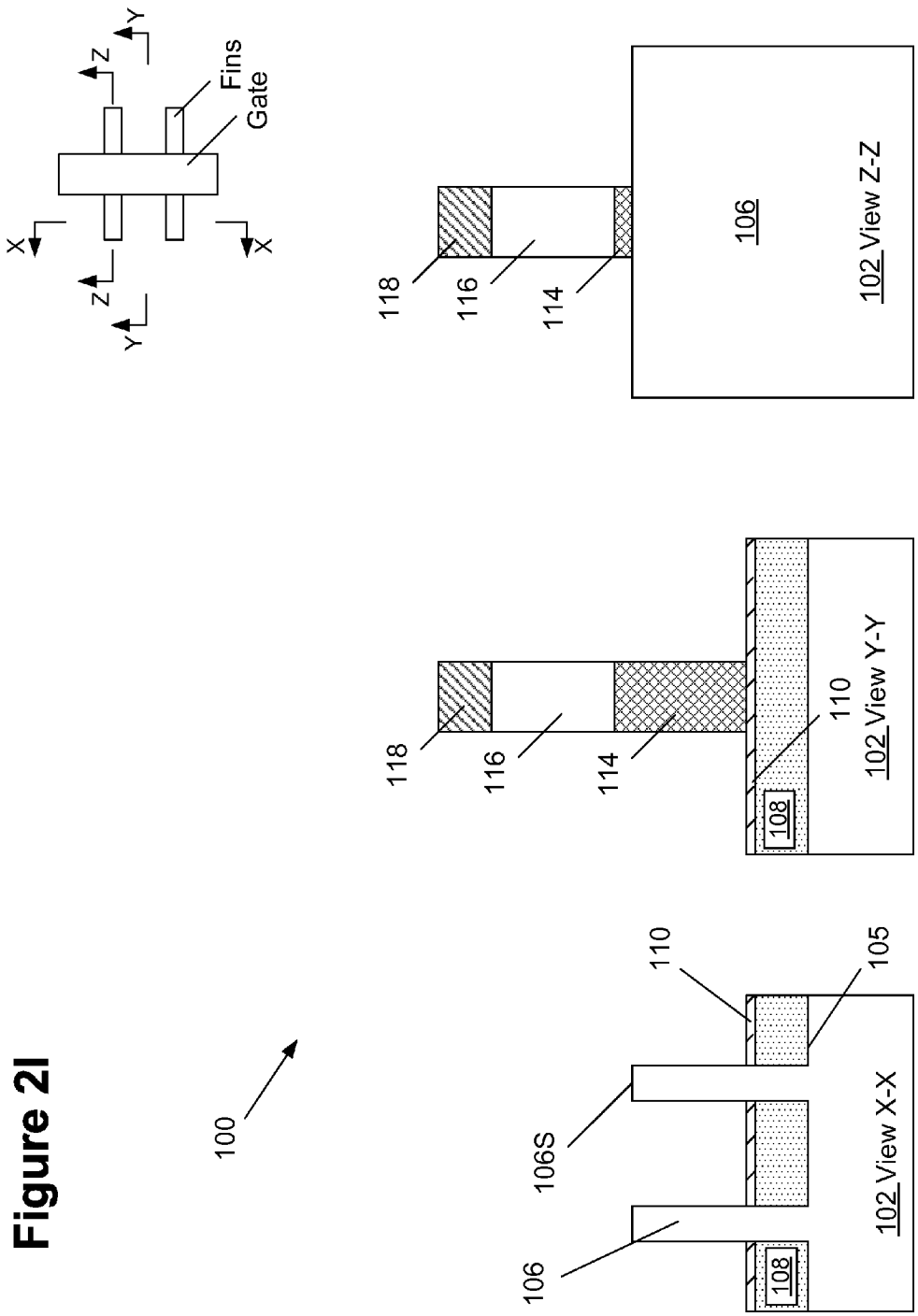

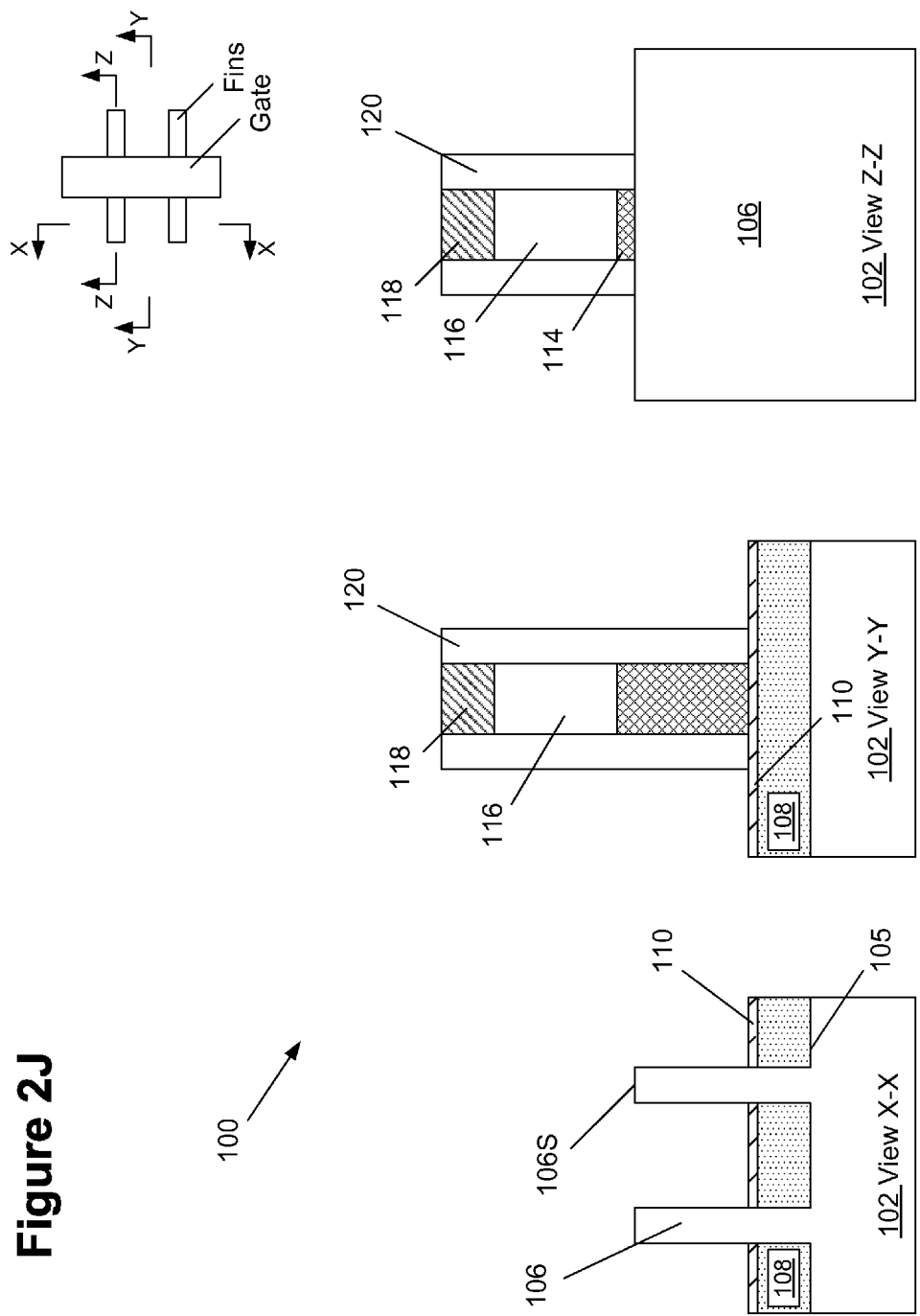

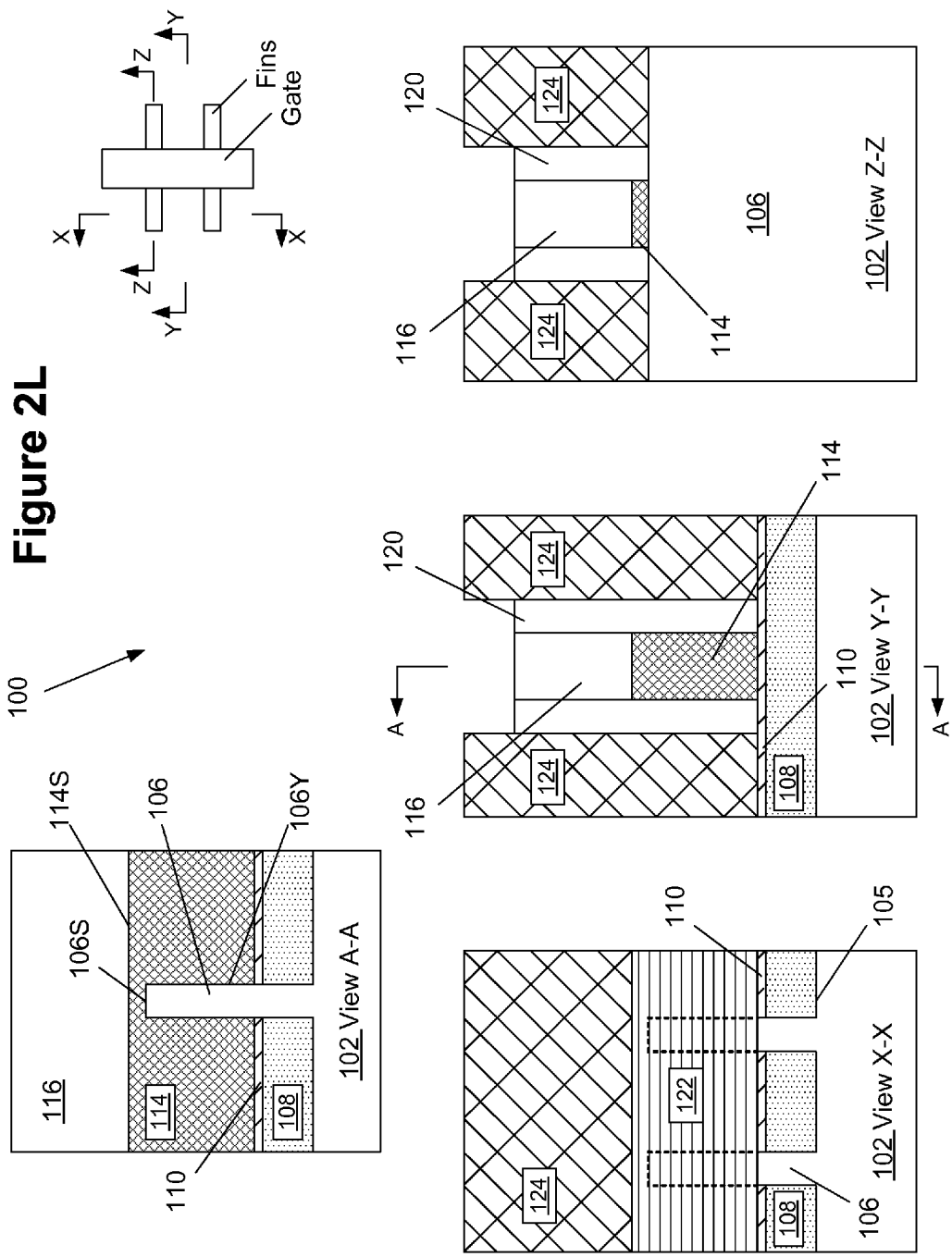

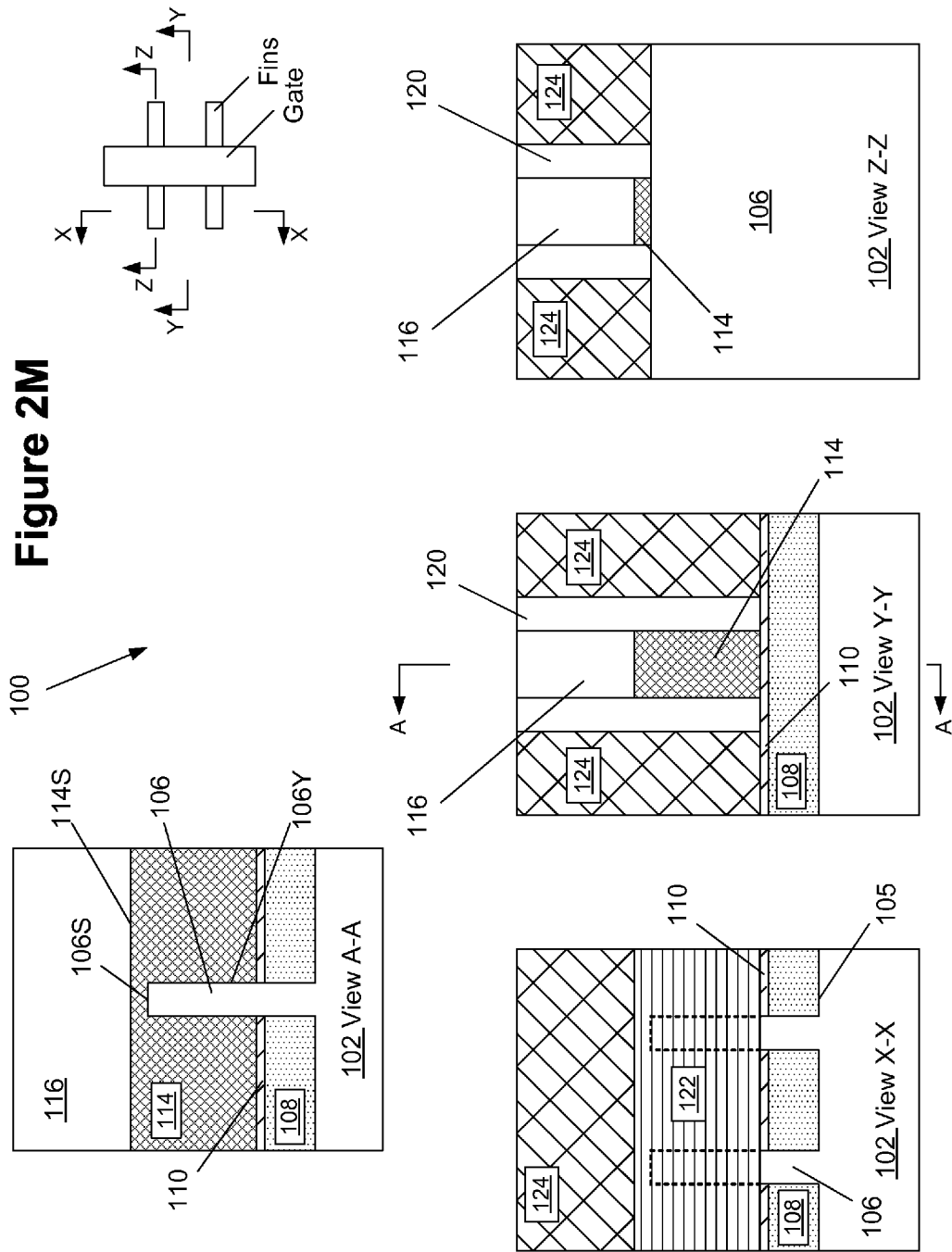

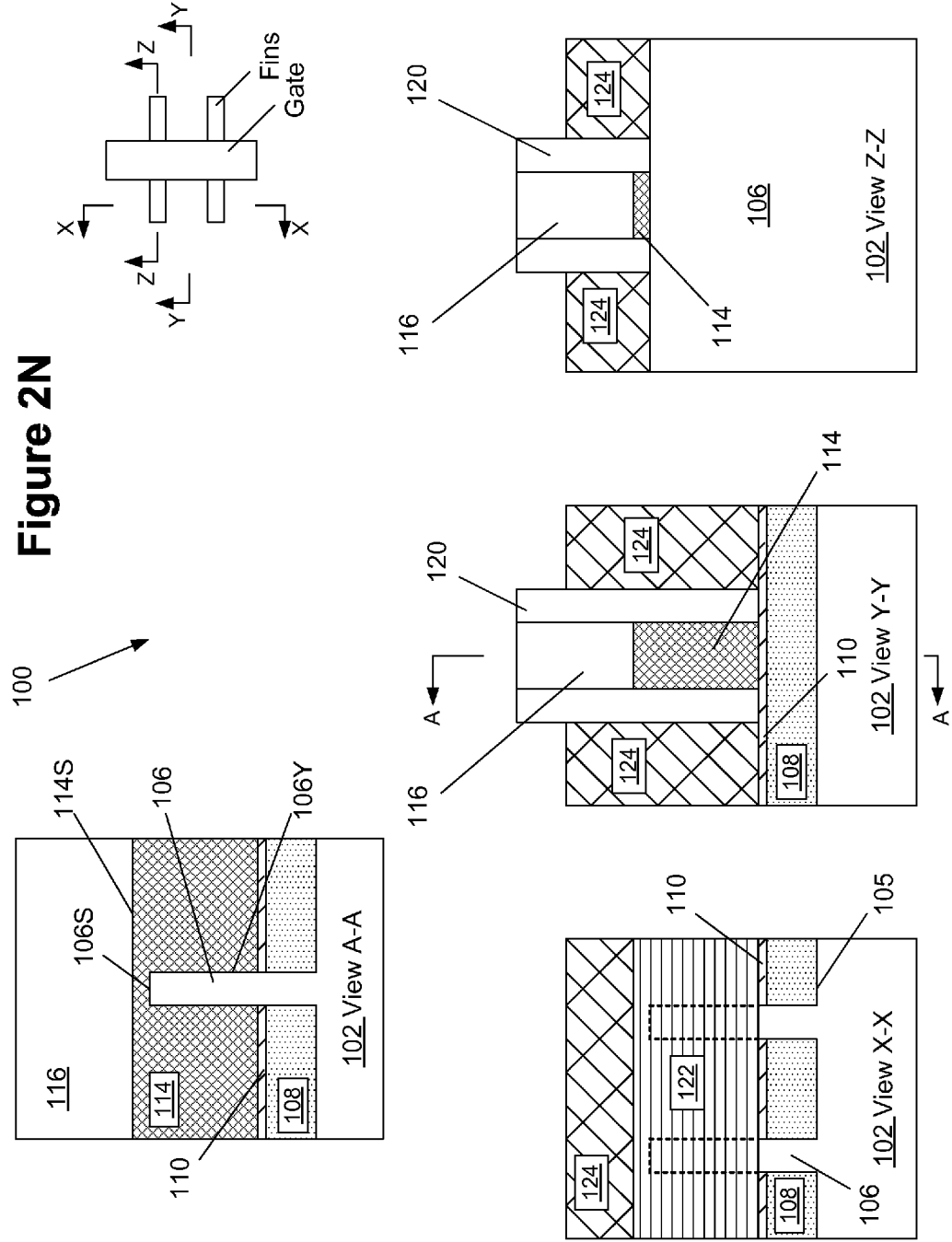

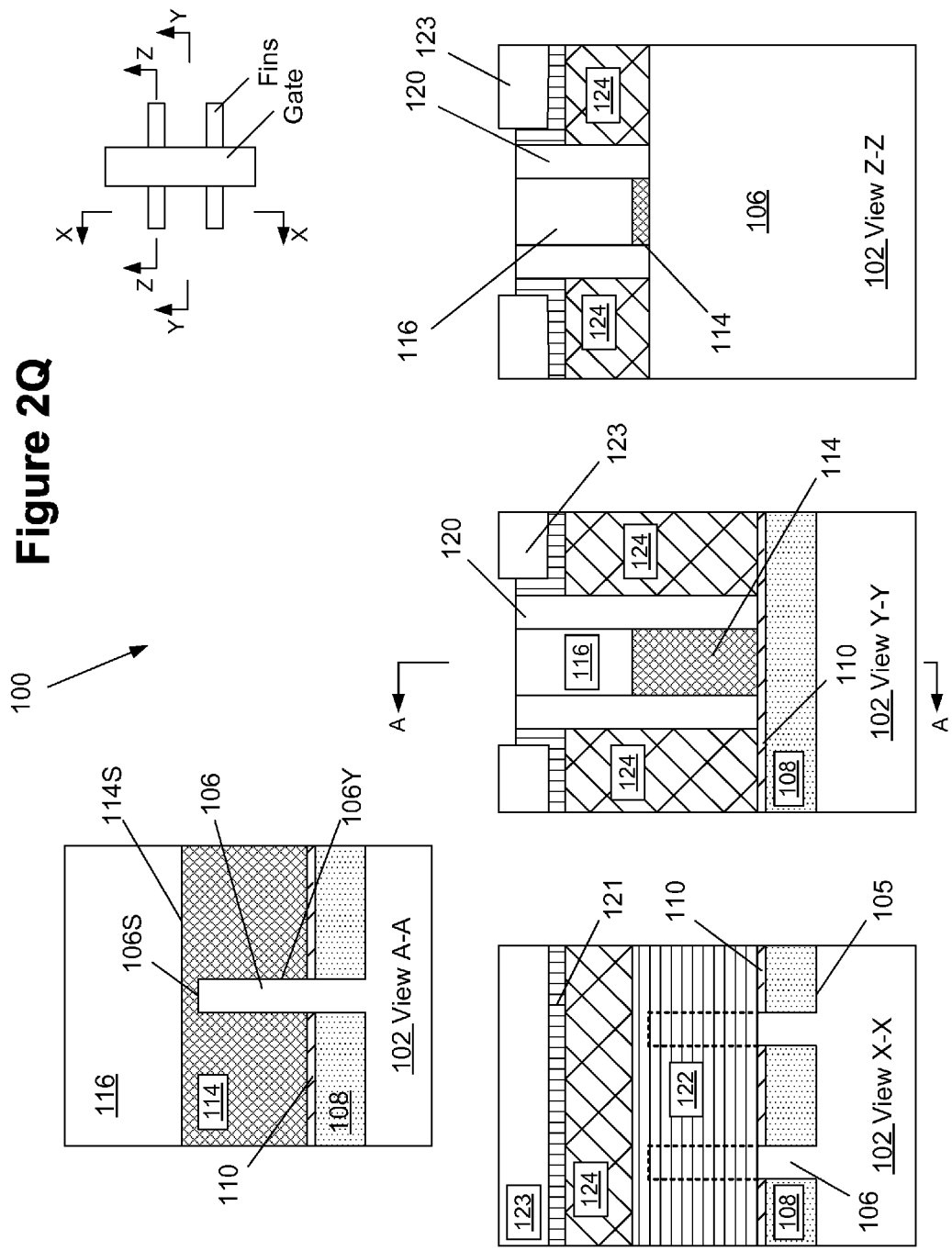

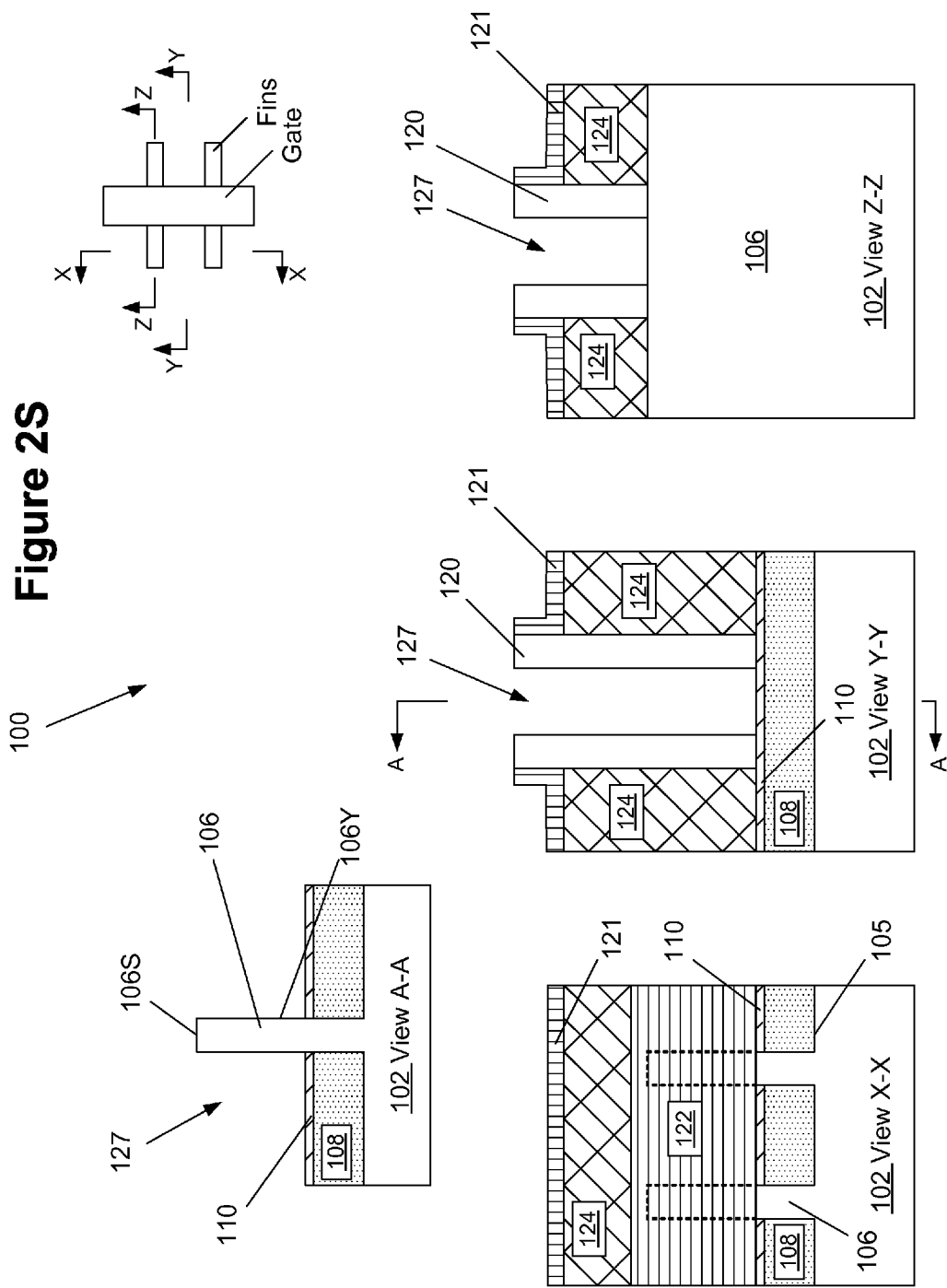

METHODS OF FORMING REPLACEMENT GATE STRUCTURES ON FINFET DEVICES AND THE RESULTING DEVICES

BACKGROUND OF THE INVENTION

1. Field of the Invention

Generally, the present disclosure relates to the manufacture of semiconductor devices, and, more specifically, to various novel methods of forming replacement gate structures on FinFET devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate cap 20. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The axial length 14L corresponds to the direction of current travel, i.e., the gate length (GL) of the device 10 when it is operational. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to grow additional semiconductor material on the fins in the source/drain regions of the device 10.

FIG. 1B depicts a simplistic plan view of the traditional FinFET device comprised of three illustrative fins 14. A cross-sectional view of the device 10 taken through the gate structure 16 is depicted in FIG. 1C. With reference to FIG. 1C, the device 10 includes a layer of insulating material 22 positioned between the fins 14, another layer of insulating material 24 that is positioned above the gate cap layer 20, and a gate contact structure 28 that is conductively coupled to the gate structure 16. The device 10 depicted in FIG. 1C is a tri-gate (or triple gate) FinFET device. That is, during operation, a very shallow conductive region 26 (shown only on the middle fin in FIG. 1C) will be established that provides a path or channel for current to flow from the source region to the drain region. The conductive region 26 forms inward of the side surfaces 14S and below the top surface 14T of the fins 14. As depicted, the overall gate length (GL) of the FinFET device 10 and the overall gate width (GW) of the FinFET device 10 are all oriented in a direction that is substantially parallel to a horizontal surface 12A of the substrate 12.

For many early device technology generations, the gate electrode structures of most transistor elements were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate structures comprised of a high-k gate insulation layer (k value of 10 or greater) and one or more metal layers, a so-called high-k dielectric/metal gate (HK/MG) configuration, have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

The formation of gate structures on FinFET devices presents several unique challenges. Typically the fins 14 are formed by performing an etching process through a patterned hard mask layer to define a plurality of trenches in a substrate. The portions of the substrate 12 covered by the patterned hard mask layer are the fins 14. A typical hard mask layer is comprised of a layer of thermally grown silicon dioxide (pad oxide) formed on the substrate 12 and a layer of silicon nitride (pad nitride) formed on the pad oxide layer. The pad nitride and pad oxide layers are then patterned using photolithographic and etching techniques to thereby define the patterned hard mask layer. In today's advanced generation devices, the fins 14 for FinFET devices are very thin, and thus easily damaged if the patterned hard mask is not thick enough. Additionally, if the pad oxide portion of the hard mask layer is too thick, then it is very hard to insure complete removal of the pad oxide portion and, thus, difficult to form tri-gate (triple-gate) FinFET devices. Normally, the process steps, i.e., the etching process module or steps that are performed to etch the substrate 12 to define the fins 14, are not readily transferable when there is a change to the structure of the fins 14. That is, if a parameter, such as fin height, fin width or hard mask thickness, is changed, then the entire etching process module needs to be re-worked, i.e., the old etching process module cannot readily be employed on fins 14 with different physical parameters. This results in a tremendous consumption of research and development time and resources to produce a new etching process module that can be employed in the fabrication facility to form the newly designed fins. These problems may be even more problematic as it relates to the formation of replacement gate structures on FinFET devices.

Another problem encountered with traditional fabrication techniques used to manufacture FinFET devices is related to topography control. Typically, after the trenches are formed that define the fins 14, a recessed layer of insulating material 22 is formed in the trenches between the fins 14. Thereafter, a sacrificial gate insulation layer is thermally grown on the exposed portions of the fins 14 above the recessed layer of insulating material 22. Next, the material for the sacrificial gate, e.g., amorphous silicon, is blanket-deposited across the substrate 12 so as to over-fill the trenches. Given the topography of the fins 14 and the trenches, the upper surface of the deposited sacrificial gate material is uneven and must be planarized (by CMP) prior to formation of a material for the gate cap layer, e.g., silicon nitride. The planarization process is a timed process, i.e., the polishing process does not stop on another material layer. Thus, the thickness of the sacrificial gate material above the upper surface of the fins 14 is controlled by the duration of the polishing process. Any variation in the polishing rate and/or duration of this polishing process causes undesirable variation in the thickness of the sacrificial gate material. Such thickness variations can occur from wafer-to-wafer and/or from lot-to-lot and can create further manufacturing problems.

The present disclosure is directed to methods of forming replacement gate structures on FinFET devices and the resulting devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures on FinFET devices and the resulting devices. One illustrative method disclosed herein includes, among other things, forming a plurality of trenches in a semiconductor substrate so as to define a fin having an upper surface and a plurality of side surfaces, forming a sacrificial gate structure comprised of a low-density oxide material having a density of less than 1.8 g/cm$^3$ positioned in the plurality of trenches and on and in contact with the upper surface and side surfaces of the fin, the low-density oxide material having an upper surface that is substantially planar and positioned at a level that is above a level of the upper surface of the fin, and a sacrificial gate material positioned on and in contact with the upper surface of the low-density oxide material, and forming a sidewall spacer adjacent the sacrificial gate structure comprised of the sacrificial gate material and the low-density oxide material. In this embodiment, the method further comprises performing a first etching process to remove the sacrificial gate material so as to thereby expose the low-density oxide material, the low-density oxide material remaining in position on the upper surface and side surfaces of the fin throughout the first etching process, removing the exposed low-density oxide material so as to define a replacement gate cavity and thereby expose the upper surface and side surfaces of the fin within the replacement gate cavity, and forming a replacement gate structure in the replacement gate cavity around the exposed upper surface and side surfaces of the fin.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict an illustrative prior art FinFET device; and

Figure 2A:
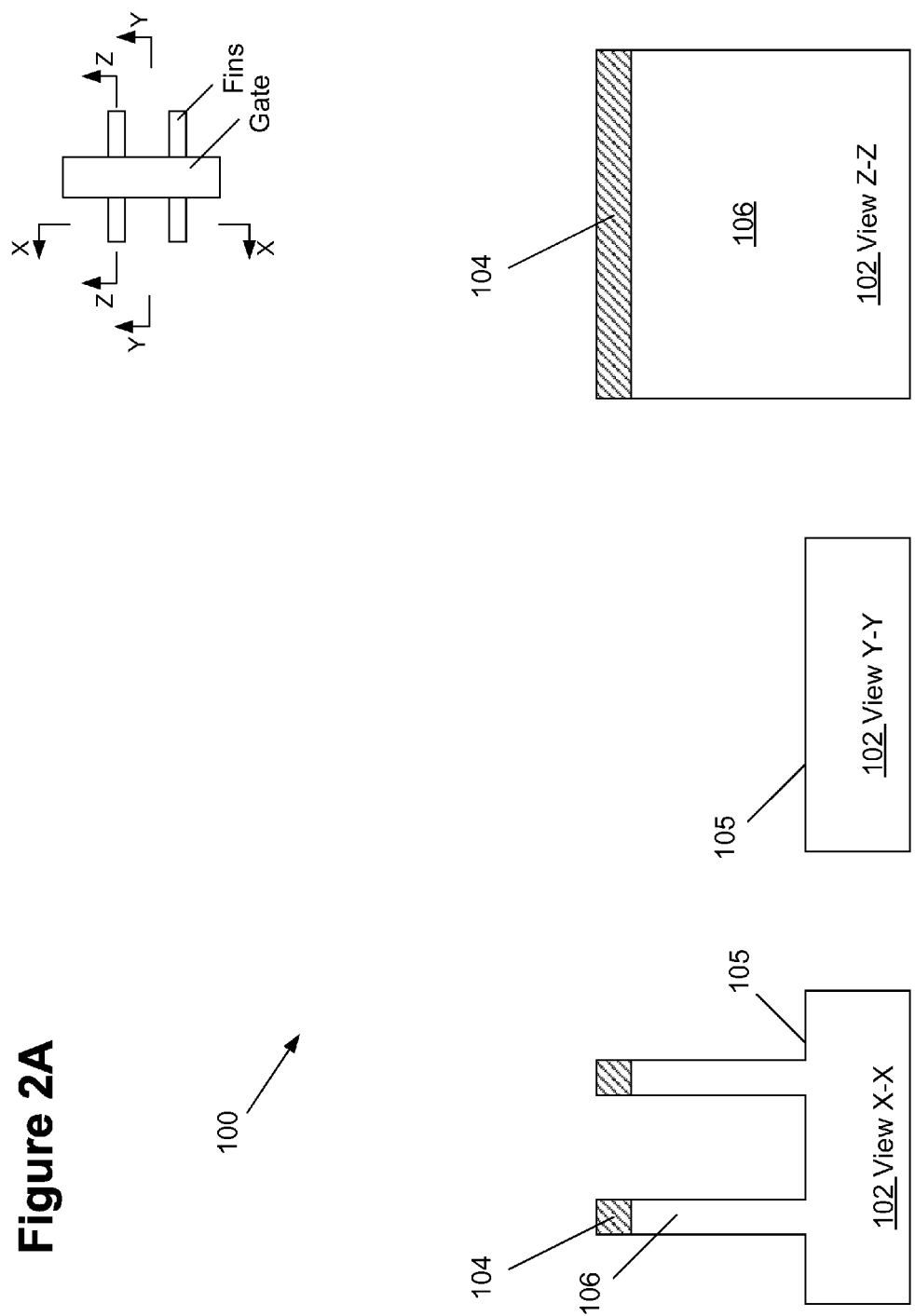
FIGS. 2A-2T depict various illustrative novel methods disclosed herein for forming replacement gate structures on FinFET devices and the resulting novel devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2B:
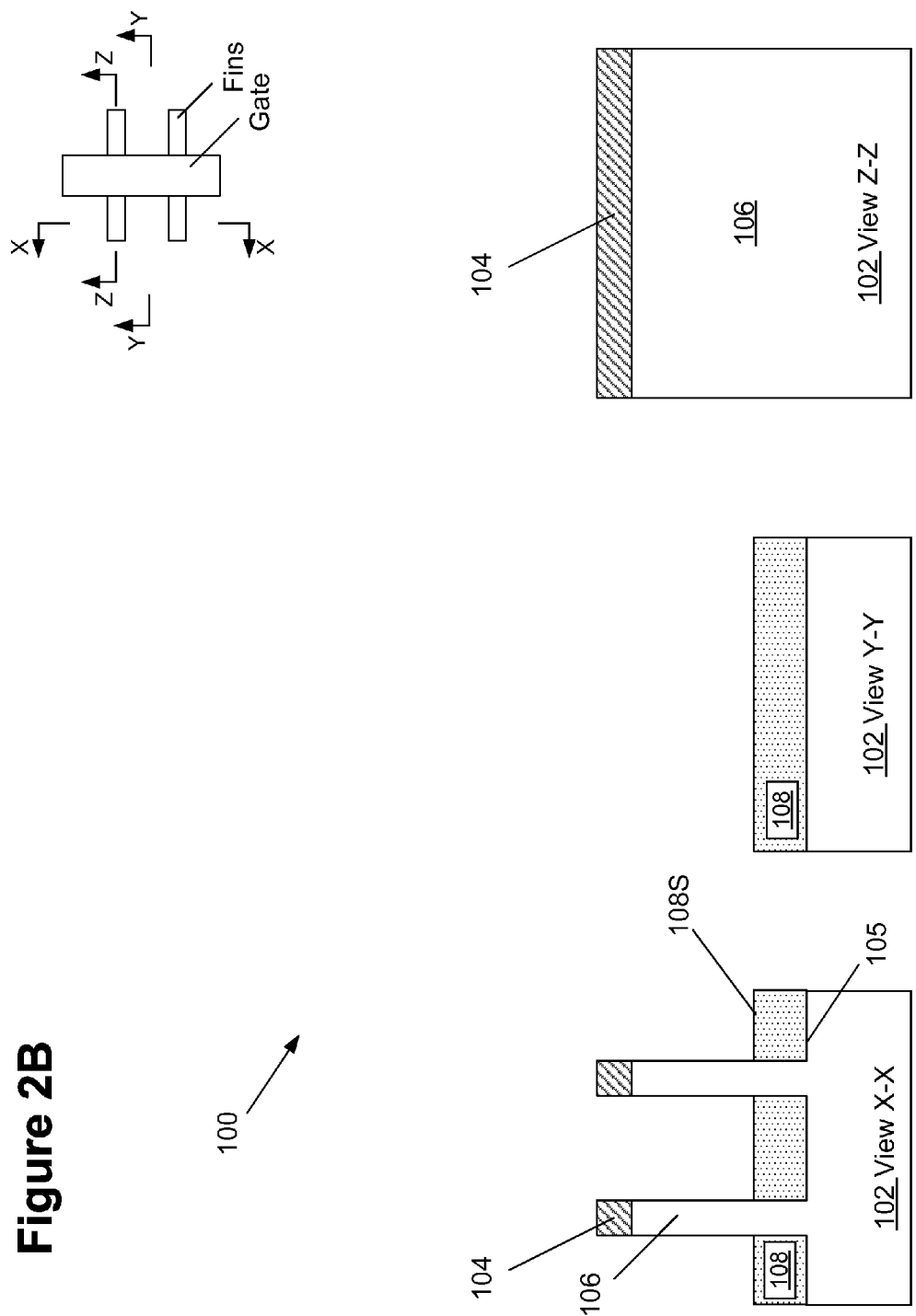
Figure 2C:
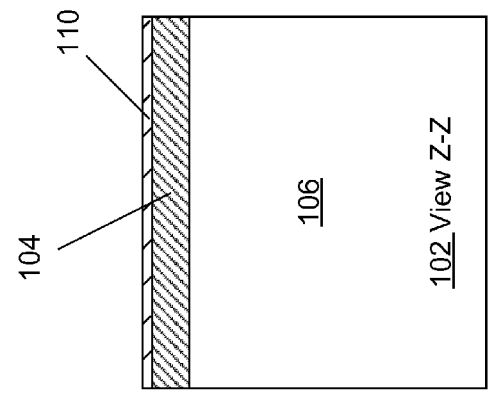
Figure 2C:
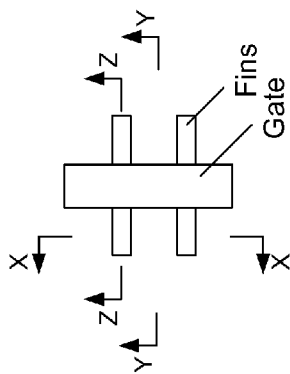
Figure 2C:
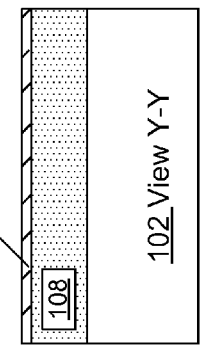
Figure 2C:
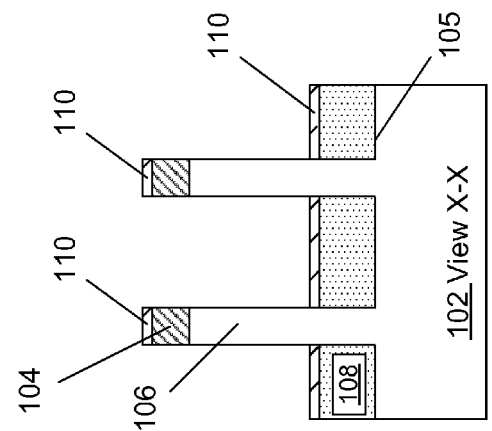
Figure 2D:
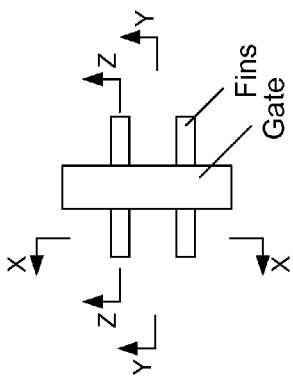
Figure 2D:
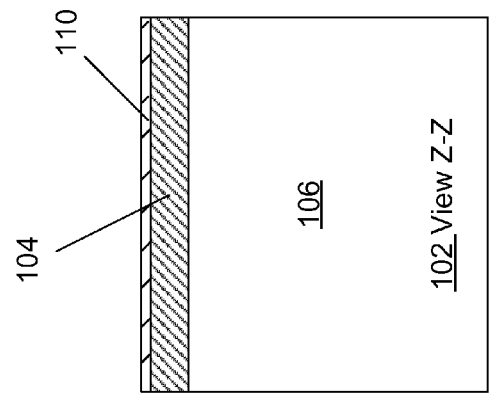
Figure 2D:
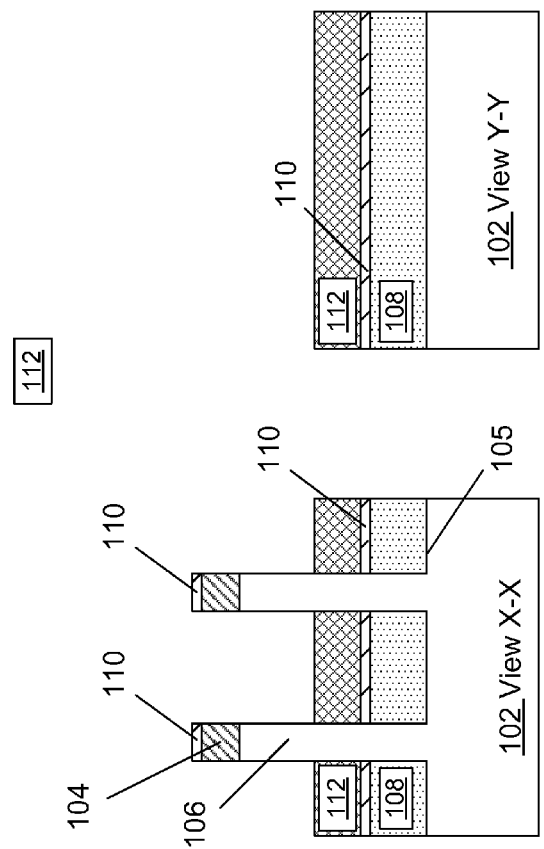
Figure 2G:
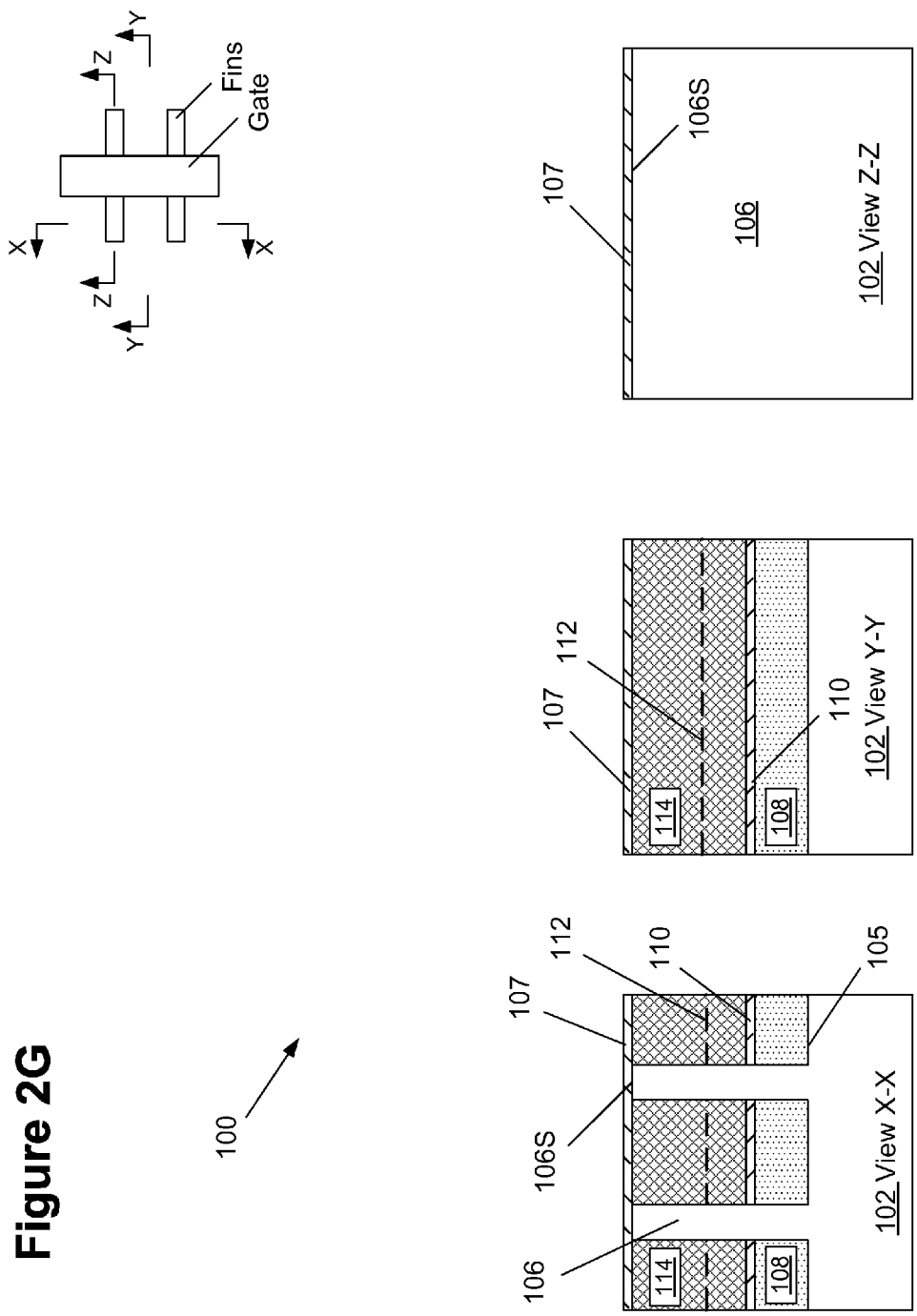
Figure 2H:
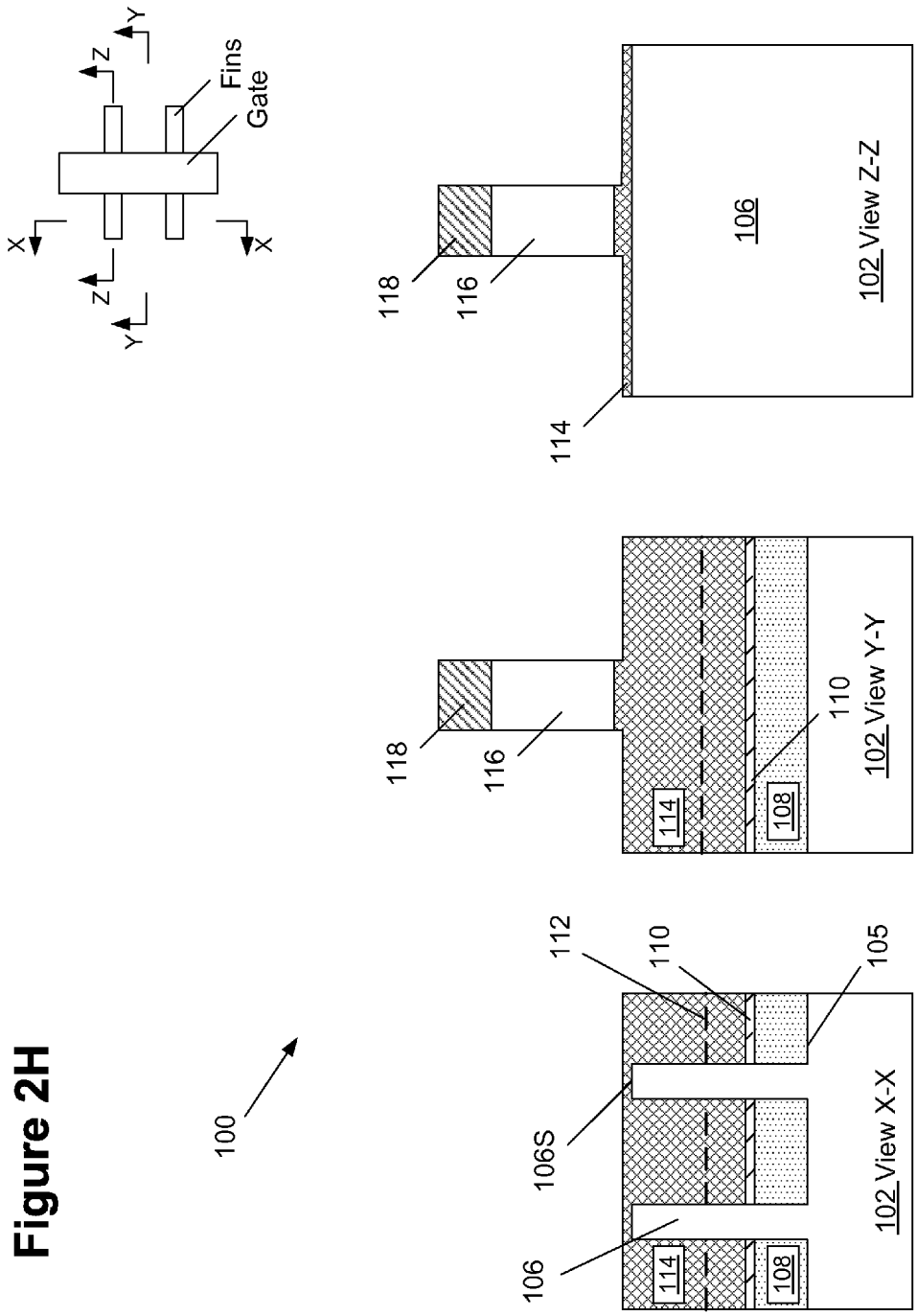
Figure 2K:
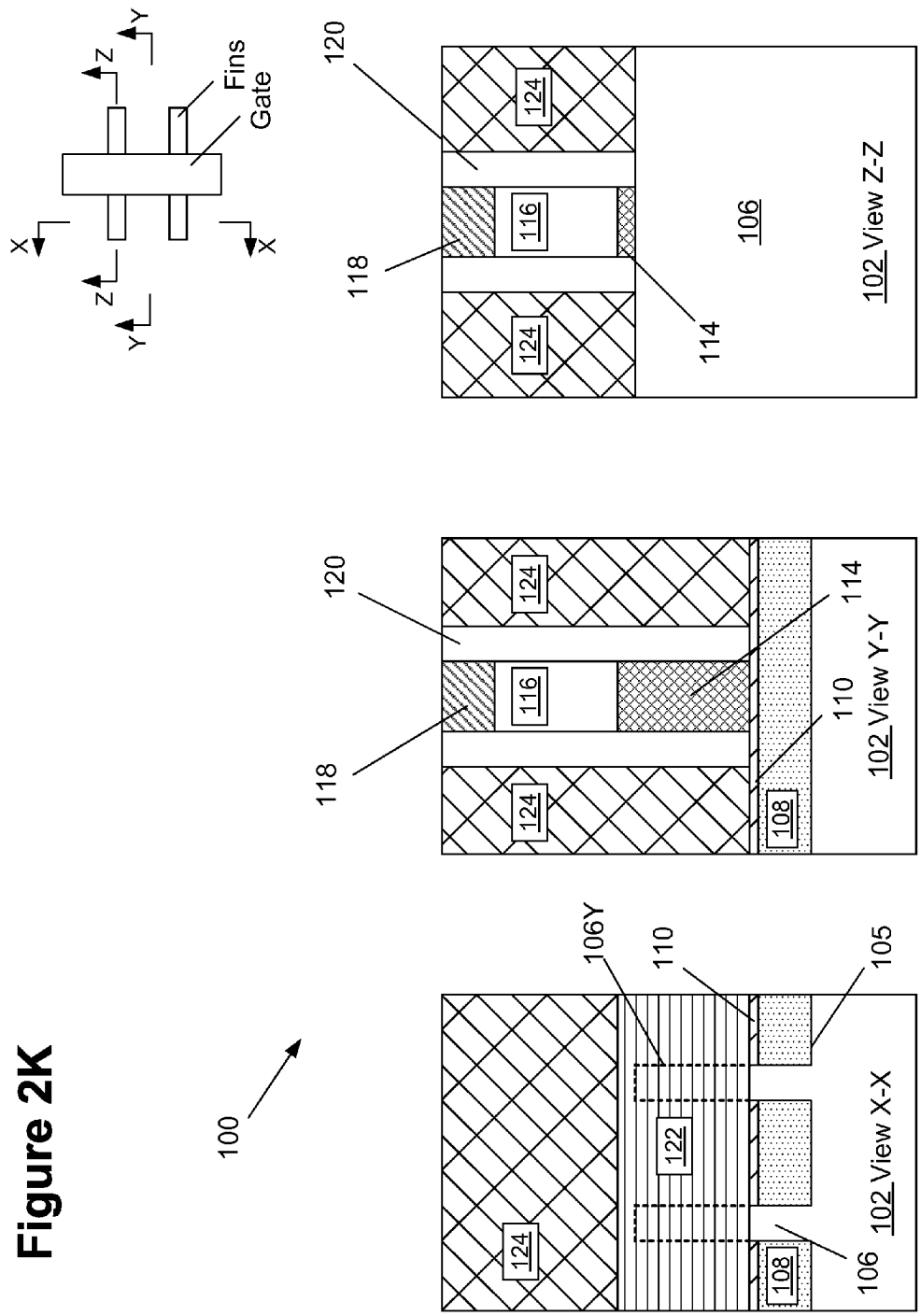
Figure 2O:
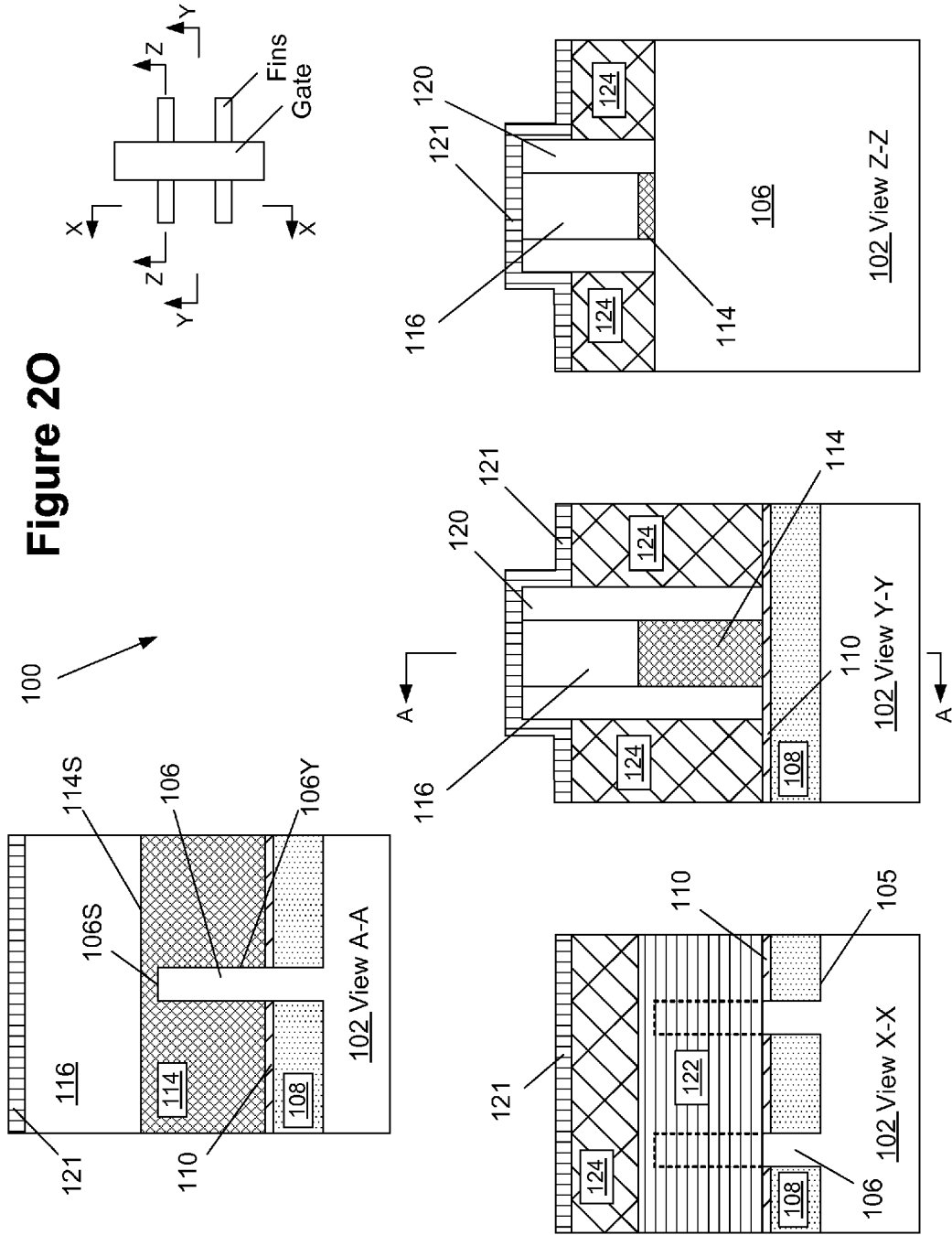
Figure 2P:
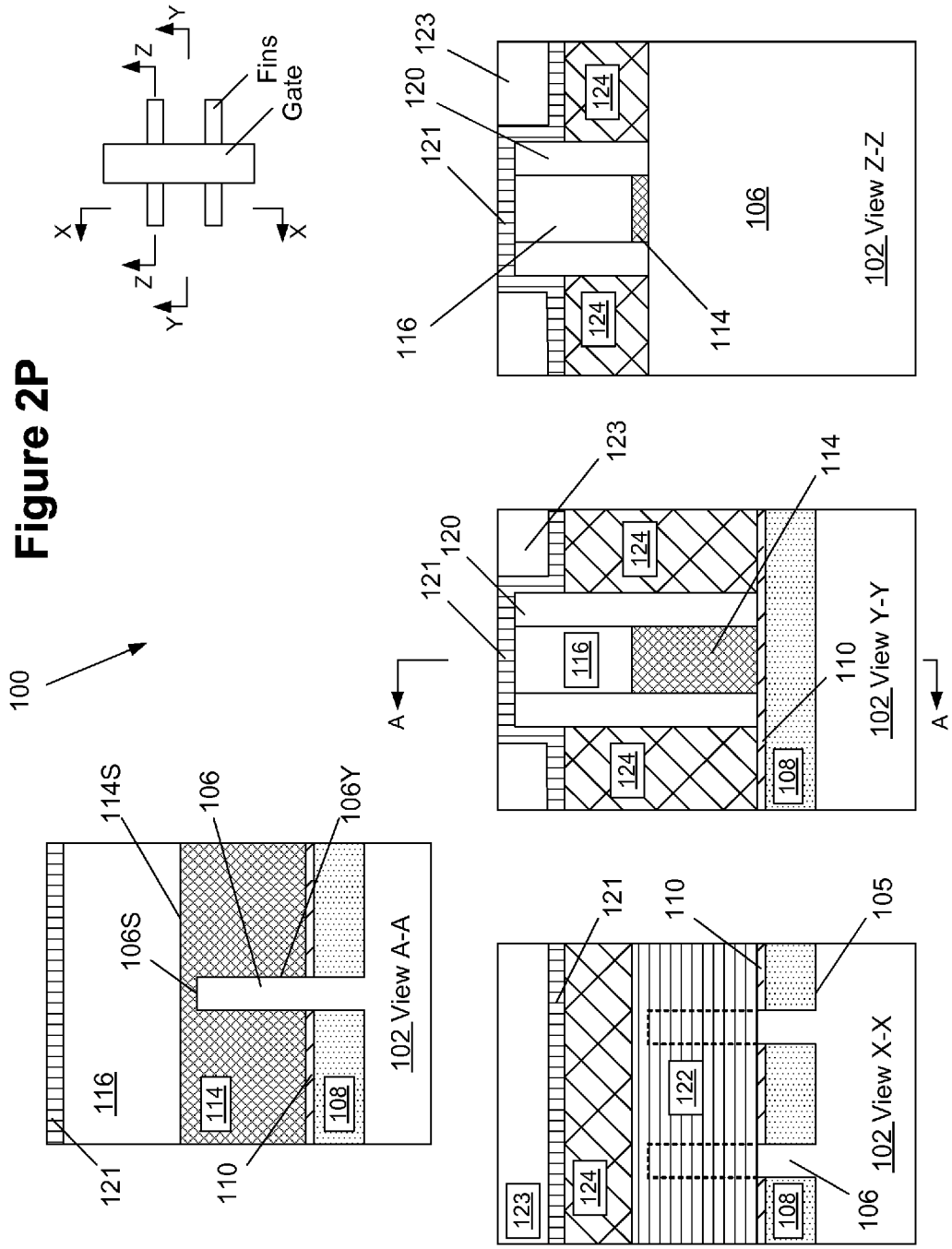
Figure 2R:
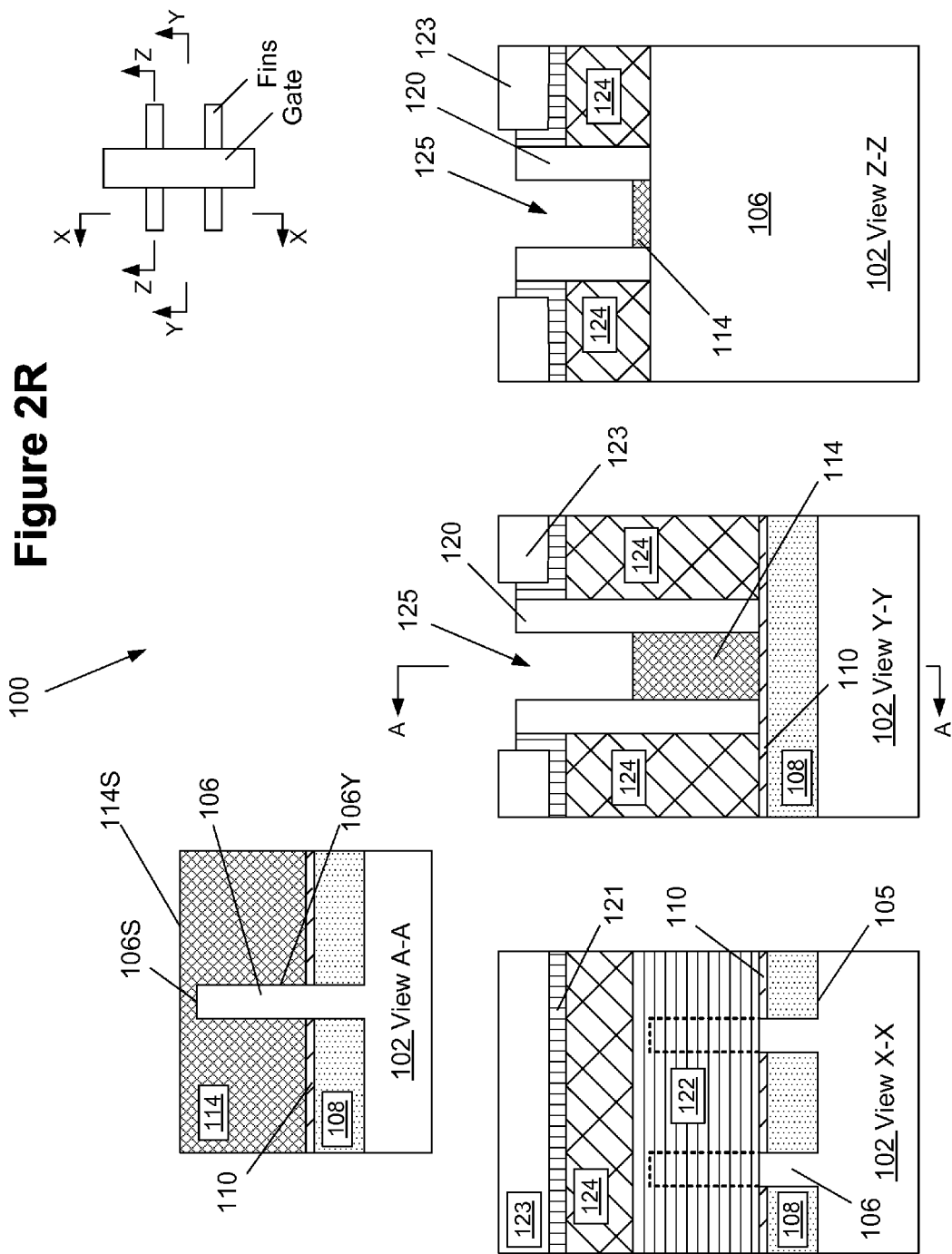
Figure 2T:
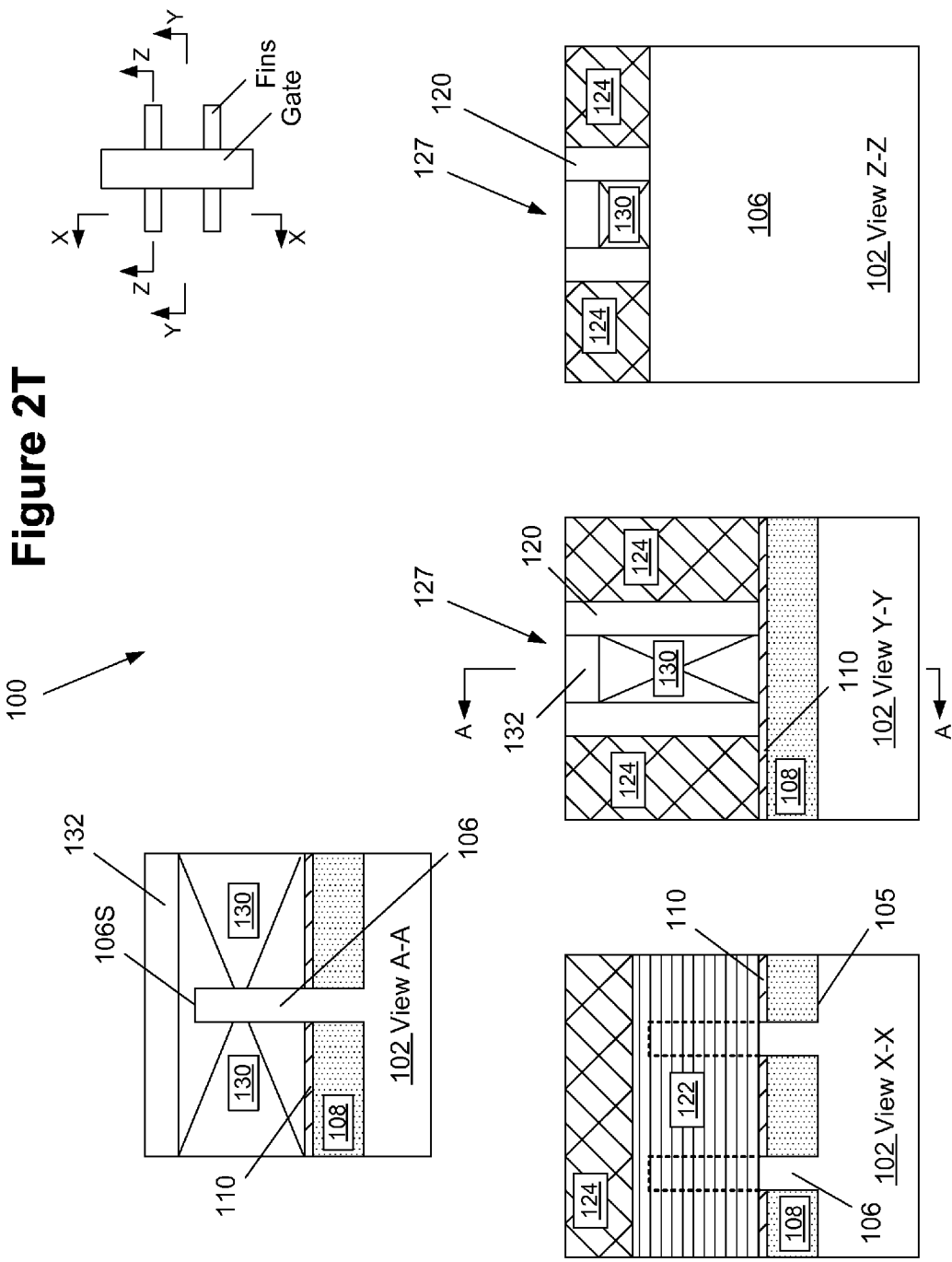

FIGS. 2A-2T present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view taken through the source/drain region of the device 100 in a direction that is transverse to the long axis of the fins (i.e., in a direction that is substantially parallel to the gate width direction of the device 100; the view "Y-Y" is a cross-sectional view that is taken through the space between the fins in a direction that is substantially parallel to the gate length direction (i.e., the current transport direction) of the device 100; and the view "Z-Z" is a cross-sectional view that is taken through the long axis of a fin transverse to the long axis of the gate structure (i.e., in the current transport direction of the device).

In the examples depicted herein, the FinFET device 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the device 100 at a point in fabrication wherein several process operations have been performed. First, a patterned etch mask 104, e.g., a combination of a silicon dioxide layer (e.g., a pad oxide—not separately shown) and a silicon nitride layer (e.g., a pad nitride—not separately shown), was formed above the substrate 102. In some cases, the pad oxide layer may be omitted if desired. Thereafter, one or more etching processes were performed through the patterned etch mask 104 so as to define a plurality of trenches 105 in the substrate 102. This results in the formation of a plurality of fins 106. The illustrative FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. The fins 106 extend laterally into and out of the drawing page in the current transport direction of the device 100 and into what will become the source/drain regions of the device 100.

With continuing reference to FIG. 2A, the overall size, shape and configuration of the trenches 105 and the fins 106 may vary depending on the particular application. The depth and width of the trenches 105 may vary depending upon the particular application. In one illustrative embodiment, based on current day technology, the overall depth (relative to the upper surface of the substrate 102) of the trenches 105 may range from approximately 20-50 nm. In the illustrative examples depicted in the attached figures, the trenches 105 and the fins 106 will be simplistically depicted as having generally rectangular portions and sections. In an actual real-world device, the sidewalls of the trenches 105 may be somewhat inwardly tapered, although that configuration is not depicted in the drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

FIG. 2B depicts the FinFET device 100 after a recessed layer of insulating material 108, e.g., silicon dioxide, was formed in the trenches 105 between the fin structures 106. The recessed layer of insulating material 108 may be formed by over-filling the trenches 105 with an insulating material, performing a CMP process on the layer of insulating material that stops on the upper surface of the patterned hard mask layer 104, and performing a recess etching process on the layer of insulating material 108 so as to recess the upper surface 108S of the layer of insulating material 108 to a desired height level within the trenches 105.

FIG. 2C depicts the FinFET device 100 after a gas cluster ion beam (GCIB) process was performed to form an etch stop layer 110 in the bottom of the trenches 105 and above the patterned hard mask layer 104. For ease of illustration, the etch stop layer 110 is provided with different cross-hatching relative to the patterned hard mask 104. In practice, the etch stop layer 110 and the patterned hard mask layer 104 may be comprised of the same material, e.g., silicon nitride, or they may be made of materials that exhibit similar etching characteristics so that they both may be removed in a common etching process. In general, the GCIB process may be performed so as to result in the formation of material 110 on the substantially horizontally oriented surfaces, such as above the hard mask layer 104, without forming appreciable amounts of the material 110 on vertically oriented surfaces. The thickness of the etch stop layer 110 may vary depending upon the particular application, e.g., about 2-10 nm.

FIG. 2D depicts the FinFET device 100 after a material layer 112 was formed between the fins 106 above the etch stop layer 110. In one illustrative example, the material layer 112 may be a low-density flowable oxide material or an OPL material. The material layer 112 may be sacrificial in nature or it may be part of the finished device, depending upon the process flow selected to form the device 100 and the material that is selected for the material layer 112. In one particular example, the material layer 112 may be a low-density oxide material having a density of less than 1.8 g/cm$^3$, such as a flowable oxide material. The low-density oxide material layer 112 may be deposited to its desired thickness by using a relatively new Novellus flowable oxide process, wherein at least some aspects of the aforementioned Novellus process are believed to be disclosed in U.S. Pat. No. 7,915,139, which is hereby incorporated by reference in its entirety. In general, the Novellus process is a relatively low-temperature process whereby the precursor material used in the process flows to the lowest level in the structure—in this case, the area in the trenches 105 between the fins 106 and above the etch stop layer 110. The parameters of the low-density oxide deposition process, such as the length of the deposition process, determines the final thickness of the low-density oxide material layer 112, which may vary depending upon the particular application. In other embodiments, the low-density oxide material layer 112 may be initially formed to a thickness greater than its desired final thickness, and a recess etching process may be performed to reduce its thickness to its final desired thickness. Irrespective of which processing technique is employed, the final thickness of the low-density oxide material layer 112 may vary depending upon the particular application, e.g., 5-10 nm. As noted above, in one particular embodiment, the low-density oxide materials discussed in this application may have a density of less than 1.8 g/cm$^3$. Such low-density oxide materials may be considered to be relatively lower quality oxide materials as compared to other higher quality oxide materials, for example, a thermally grown oxide material (density equal to about 2.27 g/cm$^3$), a PECVD deposited oxide material (density equal to about 2.1 g/cm$^3$), a HARP oxide material (density equal to about 2.0 g/cm$^3$), an HDP oxide material (density equal to about 2.16 g/cm$^3$), etc. In the case where the material layer 112 is an OPL material, the OPL layer 112 may be formed by over-filling the trenches with OPL and then recessing the OPL material to the desired height level within the trenches 105, i.e., until the portions of the etch stop layer 110 and the hard mask layer 104 positioned above the fins 106 are exposed.

FIG. 2E depicts the embodiment wherein the material layer 112 is a low-density flowable oxide material layer 112. The FinFET device 100 is depicted after one or more etching processes were performed to remove the portions of the etch stop layer 110 and the hard mask layer 104 that are not covered by the low-density oxide material layer 112. This process operation clears the upper surface 106S of the fins 106 and the side surfaces 106X of the fins of such materials. The process operation would be the same if the material layer 112 was a recessed layer of OPL material. As discussed more fully below, in the case where the material layer 112 is a low-density oxide material, it may or may not remain in position after this etching process is performed. In the case where the material layer 112 is made of an OPL material, the OPL material would normally be stripped after this etching process was performed so as to thereby expose the etch stop layer 110.

FIG. 2F depicts the FinFET device 100 after a second low-density oxide deposition process was performed to form a low-density oxide material layer 114 between the fins 106 above the etch stop layer 110. As depicted, in one illustrative embodiment, the low-density oxide material layer 114 is formed to a thickness such that its upper surface is positioned at a level that is above the upper surface 106S of the fins 106. As noted above, in one illustrative example, the low-density oxide material layer 112 may be removed prior to the formation of the low-density oxide material layer 114. In other embodiments, the low-density oxide material layer 114 may simply be formed on top of the low-density oxide material layer 112 (FIG. 2F contains a dashed line to reflect this latter technique). As before, the low-density oxide material layer 114 may be deposited to its desired thickness by using the relatively new Novellus flowable oxide process discussed above, or it may be formed by performing a deposition and etch-back process, as also described above. Irrespective of which processing technique is employed, in one illustrative embodiment, the final thickness of the low-density oxide material layer 114 is such that its thickness 114T above the upper surface 106S of the fins 106 may be about 2-10 nm.

In another embodiment, shown in FIG. 2G, a CMP process may be performed on the low-density oxide material layer 114 that stops on and exposes the upper surface 106S of the fins 106. Thereafter, a thin layer of silicon dioxide 107, e.g., 3-5 nm, may be deposited on the exposed upper surfaces 106S and the planarized upper surface of the low-density oxide material layer 114. For ease of disclosure, the remaining drawings will depict the process flow wherein the additional oxide layer 107 is not formed as described in this paragraph.

The inventions disclosed herein will be disclosed in the context of forming a gate structure for the FinFET device 100 by performing a replacement gate process. Accordingly, FIG. 2H depicts the device 100 after material for a sacrificial gate material 116 and a gate cap layer 118 were deposited above the low-density oxide material layer 114 and patterned using traditional masking and etching techniques. In general, the sacrificial gate material 116 is comprised of a material such as polysilicon or amorphous silicon, while the gate cap layer 118 is comprised of a material such as silicon nitride. The thickness of these materials may vary depending upon the particular application. Note that, unlike prior art processing techniques, the patterned sacrificial gate material 116 is formed on low-density oxide material 114, i.e., it is not formed on a layer of thermal oxide that was previously formed on the fin 106, including the upper surface 106S of the fin 106, as was the practice in at least some prior art techniques. Additionally, using the methods disclosed herein, the sacrificial gate material 116 is a substantially planar structure that is formed on or above the substantially planar upper surface of the low-density oxide layer 114, thereby eliminating or reducing the uneven topography problems described in the background section of this application wherein the sacrificial gate electrode material is formed in the trenches between the fins. In the case where the additional oxide layer 107 described above is formed, the patterned sacrificial gate material 116 would be formed on this substantially planar upper surface of the additional thin layer of oxide material 107. By using these processing techniques, the sacrificial gate material layer 116 may be formed such that it has a substantially uniform thickness across the entire substrate.

FIG. 2I depicts the FinFET device 100 after the exposed portions of the low-density oxide material layer 114 (and 112 if present) were removed by performing an anisotropic etching process to remove the low-density oxide material(s) relative to the etch stop layer 110 and the fins 106. Note that portions of the low-density oxide material 114 (and 112 if present) remain positioned under the patterned sacrificial gate material 116. In the case where the additional oxide layer 107 described above is formed, only portions of the additional thin layer of oxide material 107 would be positioned under the patterned sacrificial gate material 116 above the upper surface 106S of the fins 106. In the view Y-Y in FIG. 2I, this additional oxide layer 107 (not shown) would be positioned between the patterned low-density oxide material layer 114 and the patterned sacrificial gate material 116.

FIG. 2J depicts the FinFET device 100 after simplistically depicted sidewall spacers 120 were formed adjacent the patterned sacrificial gate material 116, the patterned gate cap layer 118 and the patterned portions of the low-density oxide material(s) 114 (and 112 if present) positioned under these structures. Collectively, the sacrificial gate material 116 and the patterned portions of the low-density oxide material(s) 114 (112) may be considered to be a sacrificial gate structure. The sidewall spacers 120 were formed by depositing a layer of spacer material (e.g., silicon nitride) and thereafter performing an anisotropic etching process. The spacers 120 may be of any desired thickness.

FIG. 2K depicts the FinFET device 100 after several process operations were performed. First, an optional fin merge process was performed wherein schematically depicted epi semiconductor material 122 was grown on the portions of the fins 106 positioned in the source/drain regions of the device 100. A dashed-line 106Y depicts the outline of the original fin structures 106. Of course, the formation of such epi material 122 in the source/drain regions of the device 100 is not required to practice the presently disclosed inventions. Thereafter, another layer of insulating material 124, such as silicon dioxide, was blanket-deposited above the device 100. Then, one or more chemical mechanical polishing (CMP) processes were performed to planarize the upper surface of the insulating material 124 with the upper surface of the gate cap layer 118.

FIG. 2L depicts the FinFET device 100 after a timed recess etching process was performed to remove the gate cap layer 118 and portions of the spacers 120 selectively relative to the surrounding structures. A special cross-sectional view (A-A) is taken where indicated in view Y-Y of FIG. 2L. View A-A is a cross-sectional view that is taken in the gate length direction of the device 100 (only a single fin 106 is shown in the view A-A). As best shown in view A-A, the low-density oxide material(s) 114 (112), considered collectively if present, are positioned on and in contact with the etch stop layer 110 and the low-density oxide material(s) is formed on and in contact with the upper surface 106S and the side surfaces 106Y of the fin 106. That is, the low-density oxide material(s) 114 (112) encapsulates the upper and side surfaces of the fin 106. Additionally, as noted above, the low-density oxide material(s) define a substantially planar upper surface 114S upon which is formed the sacrificial gate material 116. Note that the patterned sacrificial gate material 116 formed using the method disclosed herein is a substantially planar structure having a substantially uniform thickness across the entire substrate when viewed in a cross-section taken through the gate in the gate width direction of the device. Such a substantially planar layer of material for the sacrificial gate structure of a FinFET device is in stark contrast to the "stepped profile" of the polysilion or amorphous silicon portions of a sacrificial gate structure formed on FinFET devices using prior art processing techniques, wherein a thermal oxide was formed on the fins prior to the formation of the polysilicon or amorphous silicon materials for the sacrificial gate structure within the trenches between the fins. In the case where the layer of insulating material 107 is formed (see FIG. 2G), the substantially planar layer of material 116 for the sacrificial gate structure for the FinFET device 100 would be formed on and in contact with the layer of insulating material 107.

FIG. 2M depicts the FinFET device 100 after one or more planarization processes (e.g., CMP processes) were performed on the layer of insulating material 124 with the planarization process stopping on the sacrificial material layer 116.

FIG. 2N depicts the FinFET device 100 after a timed recess etching process was performed to recess the upper surface of the layer of insulating material 124 relative to the surrounding materials. The amount of recessing may vary depending upon the particular application, e.g., about 15 nm. Note that, in the depicted example, the recessed upper surface of the layer of insulating material 124 is positioned at a height level that is below the upper surfaces of the spacers 120 and the sacrificial material layer 116.

FIG. 2O depicts the FinFET device 100 after a thin insulation protection layer 121 was formed above the device 100 by performing a conformal deposition process. In one illustrative embodiment, the insulation protection layer 121 may be comprised of the same material as that of the sidewall spacers 120, e.g., silicon nitride. As discussed more fully below, the purpose of the insulation protection layer 121 is to protect the layer of insulating material 124 from being consumed when the low-density oxide material(s) are removed from between the spacers 120. Additionally, although the embodiments depicted herein depict the formation of a low-density oxide material(s) 114 within the space defined by the spacers 120, due to the presence of the insulation protection layer 121, higher quality and more dense oxide materials other than low-density oxide materials, such as a thermally grown oxide, a HARP oxide or an HDP oxide, may be formed within the space between the spacers 120. Such higher quality, denser oxide materials may be more difficult to remove than the low-density oxide material(s) depicted herein, but, in such a case, the insulation protection layer 121 serves to prevent undesirable consumption of the layer of insulating material 124 when such other higher quality oxide materials are removed from the space between the spacers 120.

FIG. 2P depicts the device 100 after another layer of insulating material 123 was deposited above the device 100 and after a CMP process was performed that stops on the insulation protection layer 121. The insulating material 123 may be comprised of a material such as silicon dioxide.

FIG. 2Q depicts the FinFET device 100 after a timed recess etching process was performed to remove the exposed portion of the insulation protection layer 121 selectively relative to the surrounding structures. This process operation exposes the sacrificial gate material 116 for removal.

FIG. 2R depicts the FinFET device 100 after one or more etching processes were performed to remove the sacrificial gate material 116 relative to the surrounding materials and particularly the low-density oxide material(s) 114 (112) positioned under the sacrificial gate material 118. The process operation results in the formation of a cavity 125 and exposes the low-density oxide material(s) 114 (112) positioned between the spacers 120.

FIG. 2S depicts the FinFET device 100 after another etching process was performed through the cavity 125 to remove the exposed low-density oxide material(s) 114 (112) selectively relative to the surrounding structures. The etching process stops on the etch stop layer 110 and the fin 106 in the channel region of the device. This process operation results in the formation of a replacement gate cavity 127 between the spacers 120 where a final replacement gate structure for the device 100 will be formed. Note that, as discussed above, during this etching process, the insulating material layer 123 will be removed when the low-density oxide material(s) 114 within the gate cavity 127 is removed, but the insulation protection layer 121 acts as an etch stop layer to prevent removal of the insulating material 124 from above the source/drain regions of the device 100.

Importantly, during the etching process depicted in FIG. 2S, the low-density oxide material(s) may be removed very quickly with a very fast cleaning process (e.g., an HF clean). In some cases, depending upon the etchants uses, the low-density oxide material(s) may be removed at a rate that is about 100 times faster than the removal rate of a traditional thermally-grown silicon dioxide material that is formed on the upper and side surfaces of the fins 106 prior to the formation of the material for the sacrificial gate material 116. Thus, using the methods disclosed herein, the surfaces of the fins 106 are much less likely to be attacked and consumed when it is a low-density oxide material that is to be removed instead of a thermally-grown oxide material. Additionally, as noted above, the presence of the etch stop layer 110 above the insulating material 108 (view Y-Y) in the gate regions effectively establishes a "hard-stop" during the etching process such there is more precise control of the vertical height of the fin 106 that is exposed and which will become part of the channel region of the device 100.

FIG. 2T depicts the FinFET device 100 after the formation of a replacement gate structure 130 and a gate cap layer 132 (e.g., silicon nitride) in the replacement gate cavity 127. The replacement gate structure 130 depicted herein is intended to be representative in nature of any type of replacement gate structure that may be employed in manufacturing integrated circuit products. Typically, a pre-clean process will be performed in an attempt to remove all foreign materials from within the replacement gate cavity 127 prior to forming the various layers of material that will become part of the replacement gate structure 130. Thereafter, the final gate structure 130 may be formed by sequentially depositing the materials of the gate structure into the replacement gate cavity 127 and above the layer of insulating material 124 and then performing a CMP process to remove excess materials above the layer of insulating material 124, including the insulation protection layer 121. Next, a recess etching process was performed to recess the materials in the gate cavity 127 to make room form the gate cate layer 132. Then, the gate cap layer 132 was formed in the replacement gate cavity 127 above the recessed gate materials. The gate cap layer 132 may be comprised of a variety of materials, e.g., silicon nitride, and it may be formed by overfilling the remaining portions of the replacement gate cavity 127 with the gate cap material and thereafter performing a CMP process to remove excess materials that stops on the layer of insulating material 124. As noted previously, the gate structure 130 may be comprised of a layer of high-k insulating material (k value of 10 or greater) and one or more layers of metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure for a FinFET device, the method comprising:
    forming a plurality of trenches in a semiconductor substrate so as to define a fin having an upper surface and a plurality of side surfaces;
    forming a sacrificial gate structure comprised of:
        a low-density oxide material having a density of less than 1.8 g/cm3 positioned in said plurality of trenches and on and in contact with said upper surface and said side surfaces of said fin, said low-density oxide material having an upper surface that is substantially planar and positioned at a level that is above a level of said upper surface of said fin; and
        a sacrificial gate material positioned on and in contact with said upper surface of said low-density oxide material;
    forming sidewall spacers adjacent said sacrificial gate structure comprised of said sacrificial gate material and said low-density oxide material;
    after forming said sidewall spacers, forming a recessed layer of insulating material in said plurality of trenches laterally outside of said spacers such that a recessed upper surface of said recessed layer of insulating material is positioned at a level that is below a level of an upper surface of said spacers and below a level of an upper surface of said sacrificial gate material;
    forming an insulation protection layer on said recessed upper surface of said recessed layer of insulating material, said upper surface of said spacers and said upper surface of said sacrificial gate material;
    removing a portion of said insulation protection layer positioned above said spacers and above said sacrificial gate material;
    with remaining portions of said insulation protection layer in position above said recessed layer of insulating material, performing a first etching process to remove said sacrificial gate material so as to thereby expose said low-density oxide material, said low-density oxide material remaining in position on said upper surface and said side surfaces of said fin throughout said first etching process, said remaining portions of said insulation protection layer protecting said recessed layer of insulating material during said first etching process;
    removing said exposed low-density oxide material so as to define a replacement gate cavity and thereby expose said upper surface and said side surfaces of said fin within said replacement gate cavity; and
    forming a replacement gate structure in said replacement gate cavity around said exposed upper surface and said side surfaces of said fin.

2. The method of claim 1, wherein, prior to forming said sacrificial gate structure, the method further comprises:
    forming a layer of insulating material in said plurality of trenches such that an upper surface of said layer of insulating material is positioned at a level that is below a level of said upper surface of said fin; and
    forming an etch stop layer on said upper surface of said layer of insulating material and above said upper surface of said fin.

3. The method of claim 2, wherein, prior to forming said sacrificial gate structure, the method further comprises:
    forming a layer of material above said etch stop layer positioned on said layer of insulating material, said layer of material having an upper surface that is positioned such that said etch stop layer positioned above said upper surface of said fin is exposed; and
    removing said exposed etch stop layer positioned above said upper surface of said fins.

4. The method of claim 3, wherein said layer of material is one of an OPL material or a flowable oxide material.

5. The method of claim 1, wherein said sacrificial gate material is comprised of one of polysilicon or amorphous silicon.

6. The method of claim 1, wherein said replacement gate structure is comprised of a high-k gate insulation layer and at least one layer of metal.

7. The method of claim 1, wherein said low-density oxide material is a flowable oxide material that is formed by performing at least two flowable oxide deposition processes.

8. The method of claim 1, wherein said low-density oxide material is a flowable oxide material that is formed by performing a single flowable oxide deposition process.

9. The method of claim 1, wherein said low-density oxide material is a flowable oxide material that is formed by removing a previously formed layer of flowable oxide material and thereafter performing a single flowable oxide deposition process.

10. The method of claim 1, wherein said sacrificial gate material is a substantially planar structure having a substantially uniform thickness when viewed in a cross-section taken in a gate width direction of said device.

11. A method of forming a replacement gate structure for a FinFET device, the method comprising:
    forming a plurality of trenches in a semiconductor substrate so as to define a fin having an upper surface and a plurality of side surfaces;
    forming a first layer of insulating material in said plurality of trenches such that a recessed upper surface of said first layer of insulating material is positioned at a level that is below a level of said upper surface of said fin;
    performing at least one process operation to form an etch stop layer on said recessed upper surface of said first layer of insulating material while leaving said upper surface and said side surfaces of said fin above said etch stop layer clear of said etch stop layer;
    forming a second layer of insulating material in said plurality of trenches and on and in contact with said upper surface and said side surfaces of said fin and an upper surface of said etch stop layer, said second layer of insulating material being formed such that an upper surface of said second layer of insulating material is substantially planar and positioned at a level that is above a level of said upper surface of said fin;
    forming a sacrificial gate material on said upper surface of said second layer of insulating material;
    patterning said sacrificial gate material and said second layer of insulating material to define a sacrificial gate structure;
    forming sidewall spacers adjacent said sacrificial gate structure comprised of said sacrificial gate material and said second layer of insulating material;
    after forming said sidewall spacers, forming a recessed layer of insulating material in said plurality of trenches laterally outside of said spacers such that a recessed upper surface of said recessed layer of insulating material is positioned at a level that is below a level of an upper surface of said spacers and below a level of an upper surface of said sacrificial gate material;
    forming an insulation protection layer on said recessed upper surface of said recessed layer of insulating material, said upper surface of said spacers and said upper surface of said sacrificial gate material;
    removing a portion of said insulation protection layer positioned above said spacers and above said sacrificial gate material;
    with remaining portions of said insulation protection layer in position above said recessed layer of insulating material, performing a first etching process to remove said sacrificial gate material between said spacers so as to thereby expose said second layer of insulating material, said second layer of insulating material remaining in position on said upper surface and said side surfaces of said fin throughout said first etching process, said remaining portions of said insulation protection layer protecting said recessed layer of insulating material during said first etching process;
    performing a second etching process that stops on said etch stop layer and removes at least a portion of said exposed second layer of insulating material so as to define a replacement gate cavity and thereby expose said upper surface and said side surfaces of said fin within said replacement gate cavity; and
    forming a replacement gate structure in said replacement gate cavity around said exposed upper surface and said side surfaces of said fin.

12. The method of claim 11, wherein forming said second layer of insulating material in said plurality of trenches comprises forming at least one of a flowable oxide material, a CVD-deposited oxide material, a HARP oxide material or an HDP oxide material.

13. The method of claim 11, wherein said second layer of insulating material formed in said plurality of trenches is a flowable oxide material.

14. The method of claim 11, wherein said sacrificial gate material is a substantially planar structure having a substantially uniform thickness when viewed in a cross-section taken in a gate width direction of said device.

15. The method of claim 11, wherein said second layer of insulating material formed in said plurality of trenches is a silicon dioxide material having a density of less than 1.8 g/cm3.

16. A method of forming a replacement gate structure for a FinFET device, the method comprising:
    forming a plurality of trenches in a semiconductor substrate so as to define a fin having an upper surface and a plurality of side surfaces;
    forming a first layer of insulating material in said plurality of trenches such that an upper surface of said first layer of insulating material is positioned at a level that is below a level of said upper surface of said fin;
    forming an etch stop layer on said upper surface of said first layer of insulating material and above said upper surface of said fin;
    forming a first oxide material layer having a density of less than 1.8 g/cm3 in said plurality of trenches and on and in contact with an upper surface of said etch stop layer and said side surfaces of said fin, said first oxide material layer being formed such that an upper surface of said first oxide material layer is substantially planar and positioned at a level that is below said upper surface of said fin;
    removing at least said etch stop layer from above said upper surface of said fin, wherein said upper surface of said fin and said side surfaces of said fin positioned above said upper surface of said first oxide material layer are free of said etch stop layer;
    forming a second oxide material layer having a density of less than 1.8 g/cm3 in said plurality of trenches and on and in contact with said upper surface of said first oxide material layer and said upper surface and said side surfaces of said fin, said second oxide material layer being formed such that an upper surface of said second oxide material layer is substantially planar and positioned at a level that is above a level of said upper surface of said fin;

forming a sacrificial gate material on said upper surface of said second oxide material layer;

patterning said sacrificial gate material and said first and second oxide material layers to define a sacrificial gate structure comprised of said sacrificial gate material and said first and second oxide material layers;

forming sidewall spacers adjacent said sacrificial gate structure;

after forming said sidewall spacers, forming a recessed layer of insulating material in said plurality of trenches laterally outside of said spacers and above said second oxide layer such that a recessed upper surface of said recessed layer of insulating material is positioned at a level that is below a level of an upper surface of said spacers and below a level of an upper surface of said sacrificial gate material;

forming an insulation protection layer on said recessed upper surface of said recessed layer of insulating material, said upper surface of said spacers and said upper surface of said sacrificial gate material;

removing a portion of said insulation protection layer positioned above said spacers and above said sacrificial gate material;

performing a first etching process to remove said sacrificial gate material between said spacers so as to thereby expose said second oxide material layer, said first and second oxide material layers, considered collectively, covering said upper surface and said side surfaces of said fin throughout said first etching process;

with remaining portions of said insulation protection layer in position above said recessed layer of insulating material, performing a second etching process to remove at least portions of said first and second oxide material layers positioned between said spacers so as to thereby define a replacement gate cavity and thereby expose said upper surface and said side surfaces of said fin within said replacement gate cavity, said remaining portions of said insulation protection layer protecting said recessed layer of insulating material during said second etching process; and forming a replacement gate structure in said replacement gate cavity around said exposed upper surface and said side surfaces of said fin.

17. The method of claim 16, wherein said sacrificial gate material is a substantially planar structure having a substantially uniform thickness when viewed in a cross-section taken in a gate width direction of said device.

18. The method of claim 16, wherein said first and second oxide material layers are made of a flowable oxide material.

* * * * *